US011335781B2

(12) United States Patent
Eom et al.

(10) Patent No.: US 11,335,781 B2
(45) Date of Patent: May 17, 2022

(54) VANADIUM DIOXIDE HETEROSTRUCTURES HAVING AN ISOSTRUCTURAL METAL-INSULATOR TRANSITION

(71) Applicant: Wisconsin Alumni Research Foundation, Madison, WI (US)

(72) Inventors: Chang-Beom Eom, Madison, WI (US); Daesu Lee, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 58 days.

(21) Appl. No.: 15/591,454

(22) Filed: May 10, 2017

(65) Prior Publication Data
US 2018/0331188 A1    Nov. 15, 2018

(51) Int. Cl.
  *H01L 29/24*    (2006.01)
  *H01L 45/00*    (2006.01)
  (Continued)

(52) U.S. Cl.
  CPC .............. *H01L 29/24* (2013.01); *H01L 29/45* (2013.01); *H01L 29/7869* (2013.01);
  (Continued)

(58) Field of Classification Search
  CPC ..... H01L 29/24; H01L 45/04; H01L 45/1253; H01L 45/146; H01L 45/1233;
  (Continued)

(56) References Cited

U.S. PATENT DOCUMENTS

| 3,547,594 A | 12/1970 | Teeg |
| 6,653,704 B1 | 11/2003 | Gurney |

(Continued)

FOREIGN PATENT DOCUMENTS

JP    2016082095    5/2016

OTHER PUBLICATIONS

J. Laverock et al., "Direct Observation of Decoupled Structural and Electronic Transitions and an Ambient Pressure Monocliniclike Metallic Phase of VO.sub.2", Physical Review Letters, p. 216402-1 to p. 216402-4, Nov. 21, 2014. (Year: 2014).*

(Continued)

*Primary Examiner* — Benjamin Tzu-Hung Liu
(74) *Attorney, Agent, or Firm* — Bell & Manning, LLC; Michelle Manning

(57) ABSTRACT

Heterostructures that include a bilayer composed of epitaxial layers of vanadium dioxide having different rutile-to-monoclinic phase transition temperatures are provided. Also provided are electrical switches that incorporate the heterostructures. The bilayers are characterized in that they undergo a single-step, collective, metal-insulator transition at an electronic transition temperature. At temperatures below the electronic transition temperature, the layer of vanadium dioxide having the higher rutile-to-monoclinic phase transition temperature has an insulating monoclinic crystalline phase, which is converted to a metallic monoclinic crystalline phase at temperatures above the electronic transition temperature.

19 Claims, 29 Drawing Sheets

(51) Int. Cl.
| | |
|---|---|
| *H01L 29/45* | (2006.01) |
| *H01L 29/94* | (2006.01) |
| *H01L 29/861* | (2006.01) |
| *H01L 29/786* | (2006.01) |
| *H03K 17/687* | (2006.01) |
| *H01L 49/00* | (2006.01) |

(52) U.S. Cl.
CPC .......... *H01L 29/8611* (2013.01); *H01L 29/94* (2013.01); *H01L 45/04* (2013.01); *H01L 45/1226* (2013.01); *H01L 45/1233* (2013.01); *H01L 45/1253* (2013.01); *H01L 45/146* (2013.01); *H01L 49/003* (2013.01); *H03K 17/687* (2013.01)

(58) Field of Classification Search
CPC ... H01L 45/1226; H01L 49/003; H01L 29/45; H01L 29/94; H01L 29/8611; H01L 29/7869; H01L 45/065; H03K 17/687
See application file for complete search history.

(56) References Cited

U.S. PATENT DOCUMENTS

| | | | |
|---|---|---|---|
| 7,583,176 | B1 | 9/2009 | Robinson |
| 7,642,881 | B1 | 1/2010 | Robinson et al. |
| 8,864,957 | B2 | 10/2014 | Ramanathan |
| 8,871,363 | B2 | 10/2014 | Tsuchiya |
| 9,627,490 | B1 | 4/2017 | Eom et al. |
| 10,160,660 | B1* | 12/2018 | Rodriguez ............ C01G 31/02 |
| 2006/0067610 | A1* | 3/2006 | Wu ........................ G02F 1/31 385/16 |
| 2008/0032441 | A1 | 2/2008 | Hirai |
| 2009/0213636 | A1 | 8/2009 | Koinuma et al. |
| 2010/0233874 | A1 | 9/2010 | Ito et al. |
| 2010/0314617 | A1 | 12/2010 | Ito |
| 2011/0151639 | A1 | 6/2011 | Lim et al. |
| 2011/0175047 | A1 | 7/2011 | Ramanathan et al. |
| 2011/0181345 | A1 | 7/2011 | Ramanathan |
| 2011/0235390 | A1 | 9/2011 | Barwicz et al. |
| 2012/0286743 | A1 | 11/2012 | Soltani et al. |
| 2013/0200457 | A1 | 8/2013 | Ogimoto |
| 2014/0085044 | A1* | 3/2014 | Hirose .................. H01C 17/12 338/314 |
| 2014/0266391 | A1 | 9/2014 | Parkin et al. |
| 2015/0207060 | A1 | 7/2015 | Schuller et al. |
| 2015/0340607 | A1 | 11/2015 | Ramanathan |
| 2017/0108752 | A1* | 4/2017 | Milliron ............... G02F 1/1524 |
| 2018/0114899 | A1* | 4/2018 | Kumar ................. H01L 47/00 |
| 2018/0259796 | A1 | 9/2018 | Ma et al. |
| 2019/0155063 | A1 | 5/2019 | Ma et al. |

OTHER PUBLICATIONS

J. Laverock et al., "Direct Observation of Decoupled Structural and Electronic Transitions and an Ambient Pressure Monocliniclike Metallic Phase of VO.sub.2", Physical Review Letters, p. 216402-1 to p. 216402-4, Nov. 21, 2014. (Year: 2014) (Year: 2014).*
Yajima et al., Drastic change in electronic domain structures via strong elastic coupling in $VO_2$ films, Physical B 91, May 6, 2015, pp. 205102-1-205102-6.
International Search Report and Written Opinion for PCT/US18/21514, dated Nov. 28, 2018.
Guo, "Modification of metal insulator transition in ultrathin $VO_2$ films vi ultra violet radiation," Masters Theses, Graduate School, The Pennsylvania State University, pp. 1-19, Dec. 31, 204.
Subramanyam et al., Thermally controlled vanadium dioxide thin film microwave devices, Midwest Symposium on Circuits and Systems, 2013, pp. 73-76.
A. Atrei et al., Composition and structure of ultrathin vanadium oxide layers deposited on SnO2(110), Surface Science 513, 2002, pp. 149-162.
Hyun Koo et al., Effect of Oxide Buffer Layer on the Thermochromic Properties of VO2 Thin Films, Journal of Materials Engineering and Performance, vol. 22 (12), Oct. 1, 2013, pp. 3967-3972.
R. Molaei et al., A microstructural approach toward the effect of thickness on semiconductor-to-metal transition characteristics of VO2 epilayers, Journal of Applied Physics 115, 164311, Apr. 29, 2014, pp. 1-8.
Zongtao Zhang et al., Solution-based fabrication of vanadium dioxide on F:SnO2 substrates with largely enhanced thermochromism and low-emissivity for energy-saving applications, Energy & Environmental Science, DOI: 10.1039/c1ee02092g, Sep. 8, 2011, pp. 1-8.
Matthias Batzill et al., The surface and materials science of tin oxide, Progress in Surface Science 79, 2005, pp. 47-154.
O.M. Osmolovskaya et al., Synthesis of Vanadium Dioxide Thin Films and Nanopowders: A Brief Review, Rev. Adv. Mater. Sci. 36, 2014, pp. 70-74.
Tsung-Han Yang et al., On growth of epitaxial vanadium oxide thin film on sapphire (0001), Journal of Materials Research, vol. 25, Issue 03, Mar. 2010, pp. 422-426.
Feliks Chudnovskiy et al., Switching device based on first-order metal insulator transition induced by external electric field, Future Trends in Microelectronics: the Nano Millennium, 2002, pp. 148-155.
Gisia Beydaghyan et al., High contrast thermochromic switching in vanadium dioxide (VO2) thin films deposited on indium tin oxide substrates, Thin Solid Films 522, Jul. 28, 2012, pp. 204-207.
A. Atrei et al., XPD Study of Vanadium Oxide Films Grown on the SnO2(110) Surface, Surface Review and Letters, vol. 6, No. 6, 1999, pp. 1187-1193.
You Zhou et al., Voltage-triggered Ultra-fast Metal-insulator Transition in Vanadium Dioxide Switches, IEEE Electron Device Letters, 34, 202, 2013, pp. 1-7.
Yaoming Sun et al., Anisotropic vanadium dioxide sculptured thin films with superior thermochromic properties, Scientific Reports 3:2756, Sep. 25, 2013, pp. 1-10.
Mikhail Esaulkov et al., Emission of terahertz pulses from vanadium dioxide films undergoing metal-insulator phase transition, Optica vol. 2, No. 9, Sep. 4, 2015, pp. 790-796.
Zheng Yang et al., Oxide Electronics Utilizing Ultrafast Metal-Insulator Transitions, Annu. Rev. Mater. Res. 41, Mar. 30, 2011, pp. 337-367.
Bellantoni et al., Monolithic GaAs p-i-n Diode Switch Circuits for High-Power Millimeter-Wave Applications, IEEE Transactions on Microwave Theory and Techniques, vol. 37, No. 12, Dec. 1989, pp. 2162-2165.
Lampen et al., A Wafer-Capped, High-Lifetime Ohmic MEMS RF Switch, International Journal of RF and Microwave Computer-Aided Engineering, vol. 14, No. 4, Jun. 9, 2004, pp. 338-344.
Goldsmith et al., Performance of Low-Loss RF MEMS Capacitive Switches, IEEE Microwave and Guided Wave Letters, vol. 8, No. 8, Aug. 1998, pp. 269-271.
Saias et al., An Above IC MEMS RF Switch, IEEE Journal of Solid-State Circuits, vol. 38, No. 12, Dec. 2003, pp. 2318-2324.
Barker, Jr. et al., Infrared Optical Properties of Vanadium Dioxide Above and Below the Transition Temperature, Physical Review Letters, vol. 17, No. 26, Dec. 26, 1966, pp. 1286-1289.
Maurer et al., Investigation of transition metal oxides by ultrasonic microscopy, Materials Science and Engineering: A, vol. 370, Issues 1-2, Apr. 15, 2004, pp. 440-443.
Aetukuri et al., Control of the metal-insulator transition in vanadium dioxide by modifying orbital occupancy, Nature Physics, vol. 9, Sep. 22, 2013, pp. 661-666.
Briggs et al., Compact silicon photonic waveguide modulator based on the vanadium dioxide metal-insulator phase transition, Optics Express, vol. 18, No. 11, May 12, 2010, pp. 11192-11201.
Zhang et al., Wafer-scale growth of VO2 thin films using a combinatorial approach, Nature Communications 6:8475, Oct. 9, 2015, pp. 1-8.
Aurelian et al., Exploiting the Semiconductor-Metal Phase Transition of VO2 Materials: a Novel Direction towards Tuneable Devices and Systems for RF-Microwave Applications, Advanced Microwave and Millimeter Wave Technologies Semiconductor Devices

(56) References Cited

OTHER PUBLICATIONS

Circuits and Systems, Moumita Mukherjee (Ed.), ISBN: 978-953-307-031-5, InTech, Mar. 1, 2010, pp. 35-56.
Ha et al., Electrical switching dynamics and broadband microwave characteristics of VO2 RF devices, J. Appl. Phys. 113, 184501, DOI: 10.1063/1.4803688, May 8, 2013.
Dumas-Bouchiat et al., rf-microwave switches based on reversible semiconductor-metal transition of VO2 thin films synthesized by pulsed-laser deposition, Applied Physics Letters 91, 223505, Nov. 27, 2007, pp. 1-3.
Madan et al., 26.5 Terahertz Electrically Triggered RF Switch on Epitaxial VO2-on-Sapphire (VOS) Wafer, 2015 IEEE International Electron Devices Meeting, Dec. 7, 2015.
Driscoll et al., Current oscillations in vanadium dioxide: Evidence for electrically triggered percolation avalanches, Physical Review B 86, 094203, Sep. 17, 2012, pp. 1-8.
Driscoll et al., Memristive adaptive filters, Applied Physics Letters 97, 093502, Sep. 1, 2010, pp. 1-3.
Driscoll et al., Phase-transition driven memristive system, Applied Physics Letters 95, 043503, Jul. 27, 2009, pp. 1-3.
Driscoll et al., Memory Metamaterials, Science, vol. 325, Sep. 18, 2009, pp. 1518-1521.
Driscoll et al., Dynamic tuning of an infrared hybrid-metamaterial resonance using vanadium dioxide, Applied Physics Letters 93, 024101, Jul. 14, 2008, pp. 1-3.
Qazilbash et al., Correlated metallic state of vanadium dioxide, Physical Review B 74, 205118, Nov. 22, 2006, pp. 1-5.
Qazilbash et al., Electrodynamics of the vanadium oxides VO2 and V2O3, Physical Review B 77, 115121, Mar. 17, 2008, pp. 1-10.
Qazilbash et al., Infrared spectroscopy and nano-imaging of the insulator-to-metal transition in vanadium dioxide, Physical Review B 79, 075107, Feb. 10, 2009, pp. 1-10.
Qazilbash et al., Mott Transition in VO2 Revealed by Infrared Spectroscopy and Nano-Imaging, Science, vol. 318, Dec. 14, 2007, pp. 1750-1753.
Qazilbash et al., Nanoscale imaging of the electronic and structural transitions in vanadium dioxide, Physical Review B 83, 165108, Apr. 13, 2011, pp. 1-7.
Berezina et al., Metal-Semiconductor Transition in Nonstoichiometric Vanadium Dioxide Films, Inorganic Materials, vol. 43, No. 5, 2007, pp. 505-511.
Boriskov et al., The Effect of Electric Field on Metal-Insulator Phase Transition in Vanadium Dioxide, Technical Physics Letters, vol. 28, No. 5, 2002, pp. 406-408.
Chudnovskii et al., Electroforming and Switching in Oxides of Transition Metals: The Role of Metal-Insulator Transition in the Switching Mechanism, Journal of Solid State Chemistry 122, Article No. 0087, 1996, pp. 95-99.
Pergament et al., Oxide Electronics and Vanadium Dioxide Perspective: A Review, Journal on Selected Topics in Nano Electronics and Computing, vol. 1, No. 1, Dec. 2013, pp. 24-43.
Pergament et al., Phase composition of anodic oxide films on transition metals: a thermodynamic approach, Thin Solid Films 322, 1998, pp. 33-36.
Stefanovich et al., Anodic oxidation of vanadium and properties of vanadium oxide films, J. Phys.: Condens. Matter 16, May 28, 2004, pp. 4013-4024.
Stefanovich et al., Electrical switching and Mott transition in VO2, J. Phys.: Condens. Matter 12, 2000, pp. 8837-8845.
Weiss et al., Ultrafast Silicon-Based Modulators Using Optical Switching of Vanadium O2, Final Report, Apr. 12, 2014, pp. 1-20.
Ryckman et al., Photothermal optical modulation of ultra-compact hybrid Si—VO2 ring resonators, Optics Express, vol. 20, No. 12, May 29, 2012, pp. 13215-13225.
Joushaghani et al., Wavelength-size hybrid Si—VO2 waveguide electroabsorption optical switches and photodetectors, Optics Express, vol. 23, No. 3, Feb. 5, 2015, pp. 3657-3668.

Kats et al., Vanadium Dioxide as a Natural Disordered Metamaterial: Perfect Thermal Emission and Large Broadband Negative Differential Thermal Emittance, Physical Review X 3, 041004, Oct. 21, 2013, pp. 1-7.
Kim et al., Nanoscale imaging and control of resistance switching in VO2 at room temperature, Applied Physics Letters 96, 213106, May 25, 2010, pp. 1-3.
Ko et al., Stability of electrical switching properties in vanadium dioxide thin films under multiple thermal cycles across the phase transition boundary, Journal of Applied Physics 104, 086105, Oct. 30, 2008, pp. 1-3.
Ruzmetov et al., Infrared reflectance and photoemission spectroscopy studies across the phase transition boundary in thin film vanadium dioxide, J. Phys.: Condens. Matter 20, 465204, Oct. 21, 2008, pp. 1-5.
Ruzmetov et al., Hall carrier density and magnetoresistance measurements in thin-film vanadium dioxide across the metal-insulator transition, Physical Review B 79, 153107, Apr. 20, 2009, pp. 1-4.
Ruzmetov et al., Structure-functional property relationships in rf-sputtered vanadium dioxide thin films, Journal of Applied Physics 102, 113715, Dec. 11, 2007, pp. 1-7.
Seo et al., Voltage-Pulse-Induced Switching Dynamics in VO2 Thin-Film Devices on Silicon, IEEE Electron Device Letters, vol. 32, No. 11, Nov. 2011, pp. 1582-1584.
Yang et al., Studies on electric triggering of the metal-insulator transition in VO2 thin films between 77 K and 300 K, Journal of Applied Physics 110, 033725, Aug. 15, 2011, pp. 1-5.
Yang et al., Dielectric and carrier transport properties of vanadium dioxide thin films across the phase transition utilizing gated capacitor devices, Physical Review B 82, 205101, Nov. 1, 2010, pp. 1-8.
Yang et al., Studies on room-temperature electric-field effect in ionic-liquid gated VO2 three-terminal devices, Journal of Applied Physics 111, 014506, Jan. 6, 2012, pp. 1-5.
Zhou et al., Voltage-Triggered Ultrafast Phase Transition in Vanadium Dioxide Switches, IEEE Electron Device Letters, vol. 34, No. 2, Jan. 4, 2013, pp. 220-222.
Moore et al., A Surface-Tailored, Purely Electronic, Mott Metal-to-Insulator Transition, Science 318, Oct. 26, 2007, pp. 615-619.
F. J. Morin, Oxides which show a metal-to-insulator transition at the Neel temperature. Phys. Rev. Lett., vol. 3, No. 1, Jul. 1, 1959, pp. 34-36.
Morrison et al., A photoinduced metal-like phase of monoclinic $VO_2$ revealed by ultrafast electron diffraction, Science 346, Oct. 24, 2014, pp. 445-448.
Wegkamp et al., Instantaneous band gap collapse in photoexcited monoclinic $VO_2$ due to photocarrier doping, Phys. Rev. Lett. 113, Nov. 17, 2014, pp. 216401-1-216401-5.
Arcangeletti et al., Evidence of a pressure-induced metallization process in monoclinic $VO_2$. Phys. Rev. Lett. 98, May 10, 2007, pp. 196406-1-196406-4.
Tao et al., Decoupling of structural and electronic phase transitions in $VO_2$, Phys. Rev. Lett. 109, Oct. 18, 2012, pp. 166406-1-166406-5.
Ko et al., Work function of vanadium dioxide thin films across the metal-insulator transition and the role of surface nonstoichiometry, ACS Appl. Mater. Interfaces 3, Aug. 9, 2011, pp. 3396-3401.
Griffiths et al., Influence of stoichiometry on the metal-semiconductor transition in vanadium dioxide, J. Appl. Phys. 45, 1974, pp. 2201-2206.
International Search Report and Written Opinion mailed in PCT/US2018/019397, dated May 17, 2018.
Extended Search Report issued on EP 18813825.9, dated Jan. 11, 2021.
N. Nakano et al., "Collective bulk carrier delocalization driven by electrostatic surface charge accumulation," Nature, vol. 487, No. 7408, Jul. 1, 2012, pp. 459-462.
Office Action issued on CN201880030668.7, dated Mar. 1, 2021.

\* cited by examiner

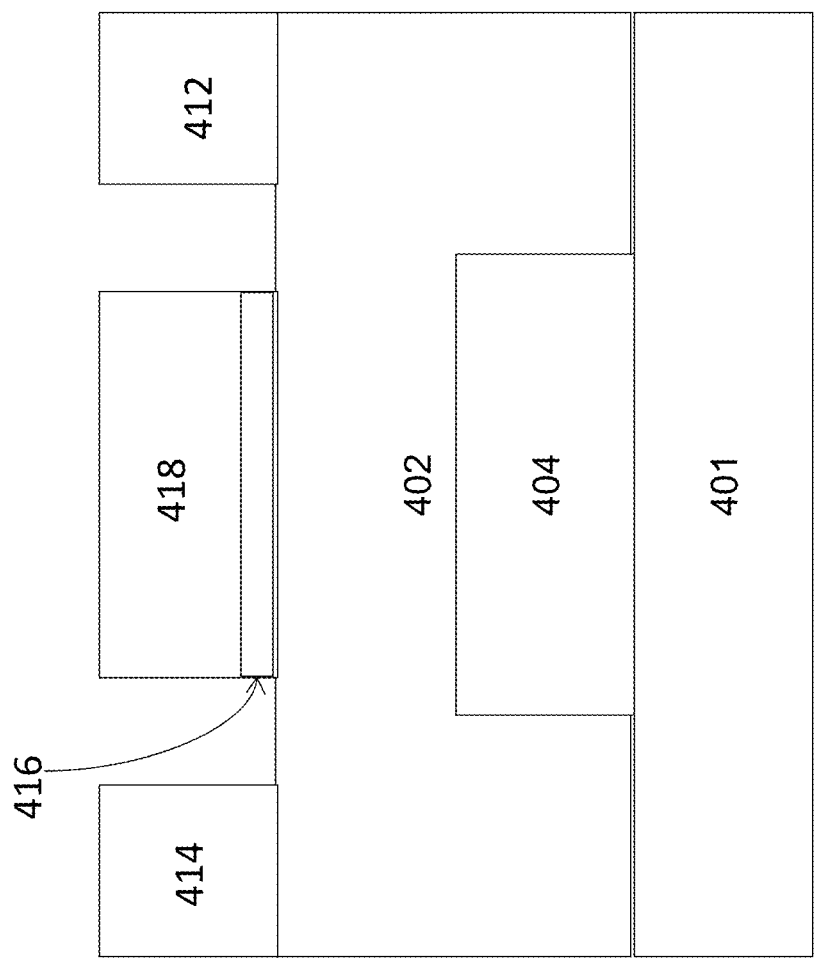

FIG. 5A  FIG. 5B
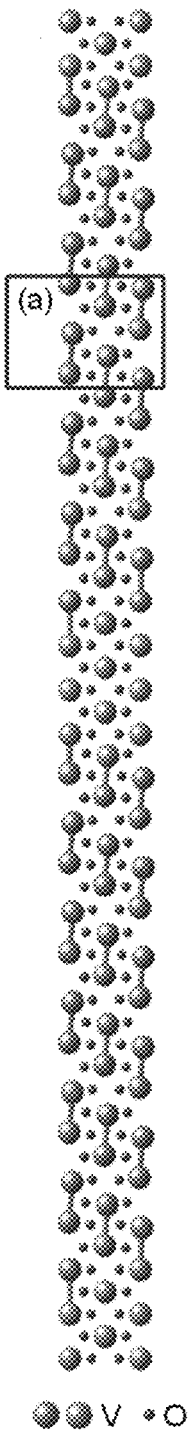
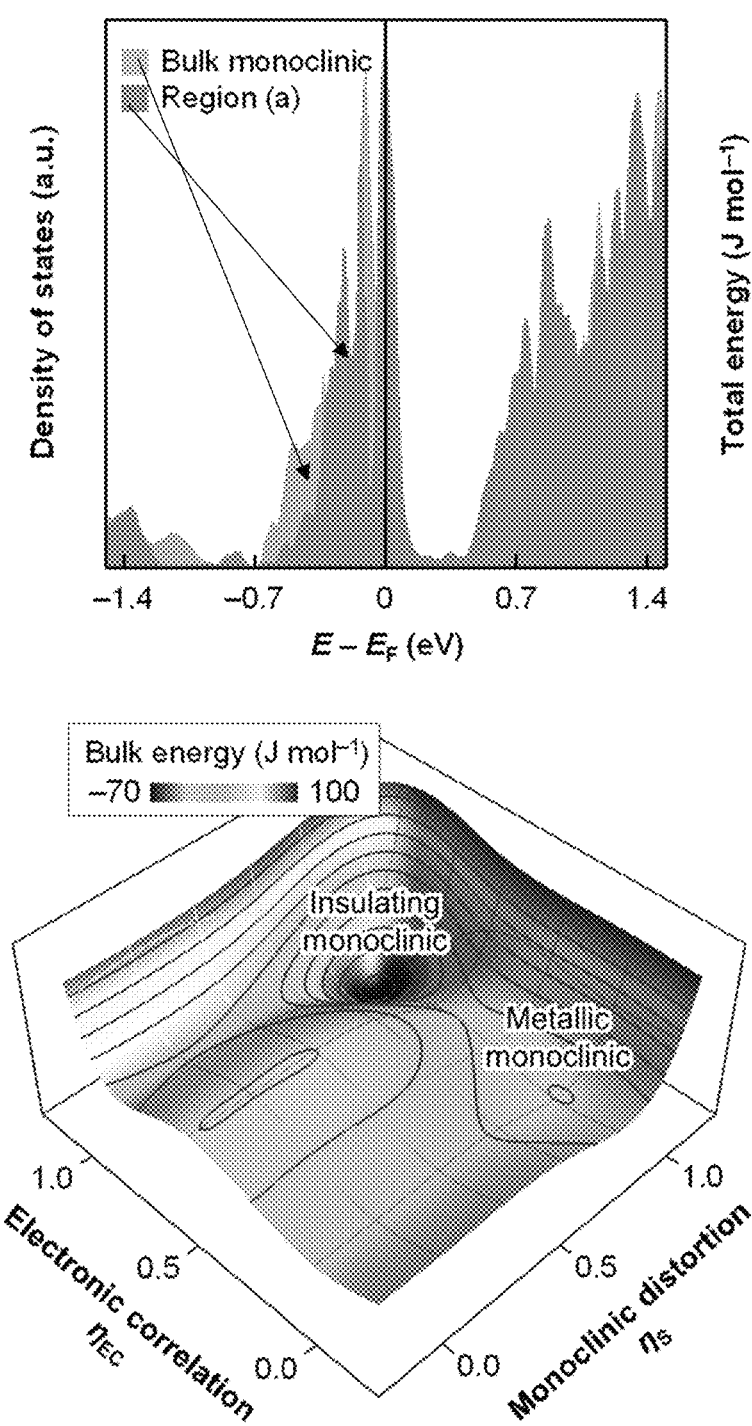
FIG. 5C

FIG. 5D
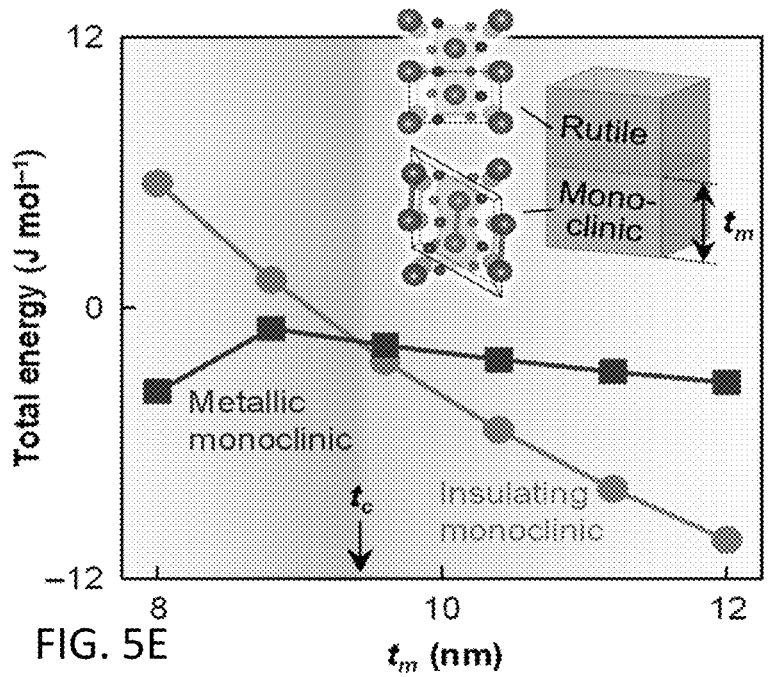
FIG. 5E
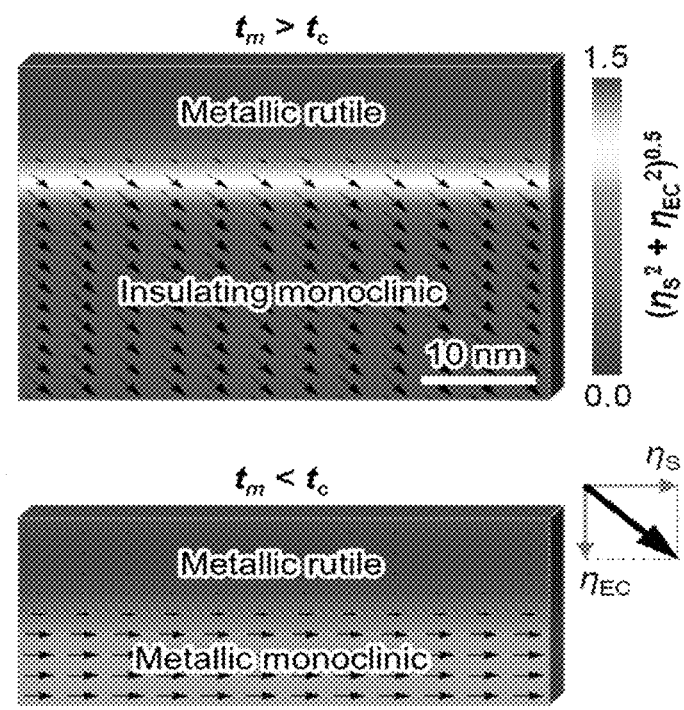
FIG. 5F

FIG. 6A
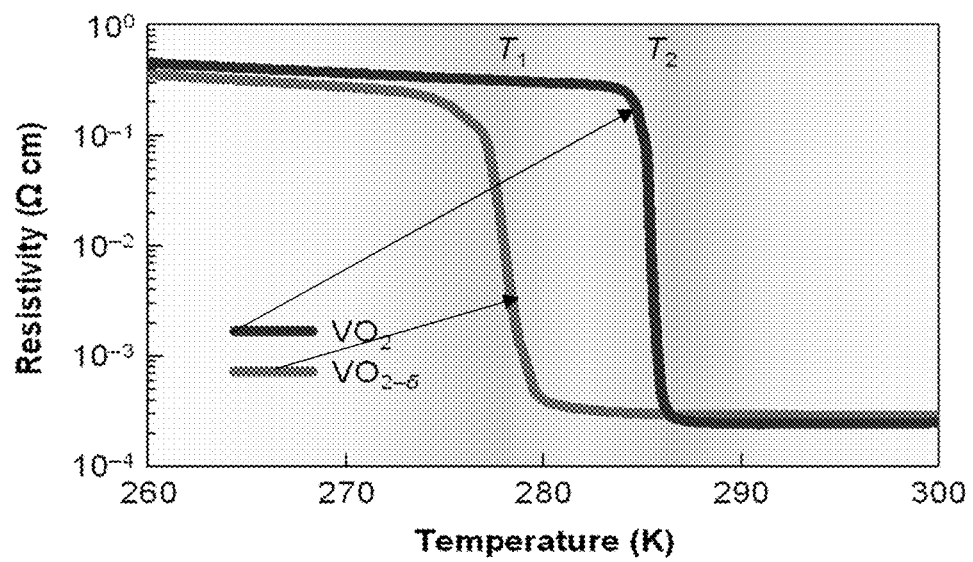
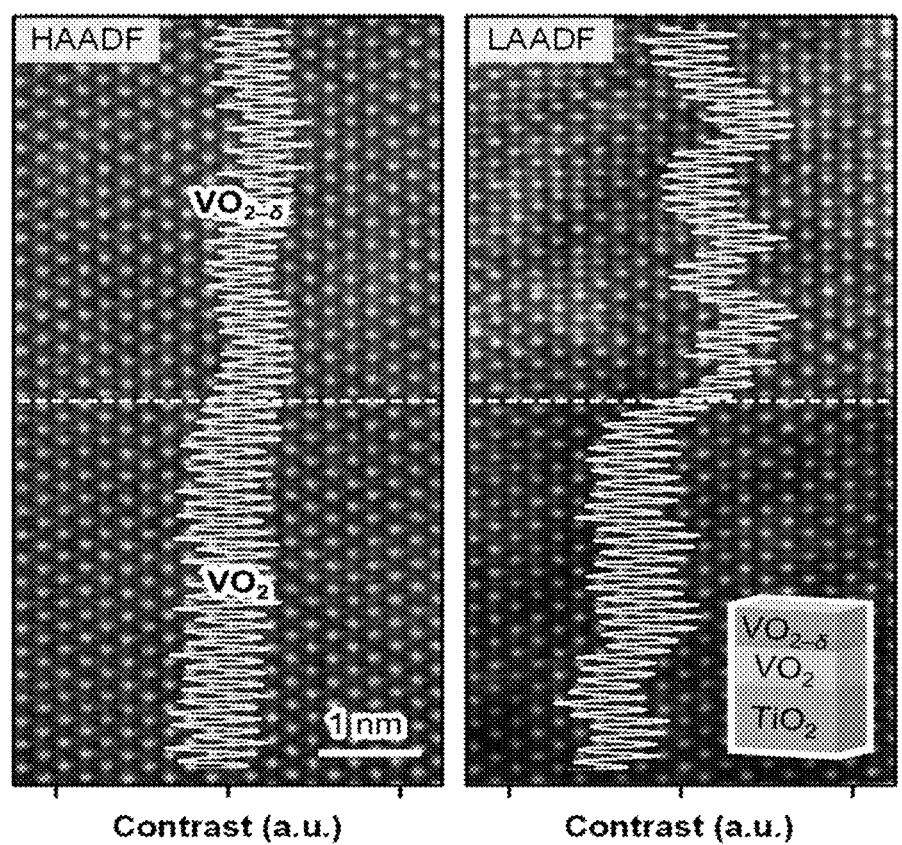
FIG. 6B

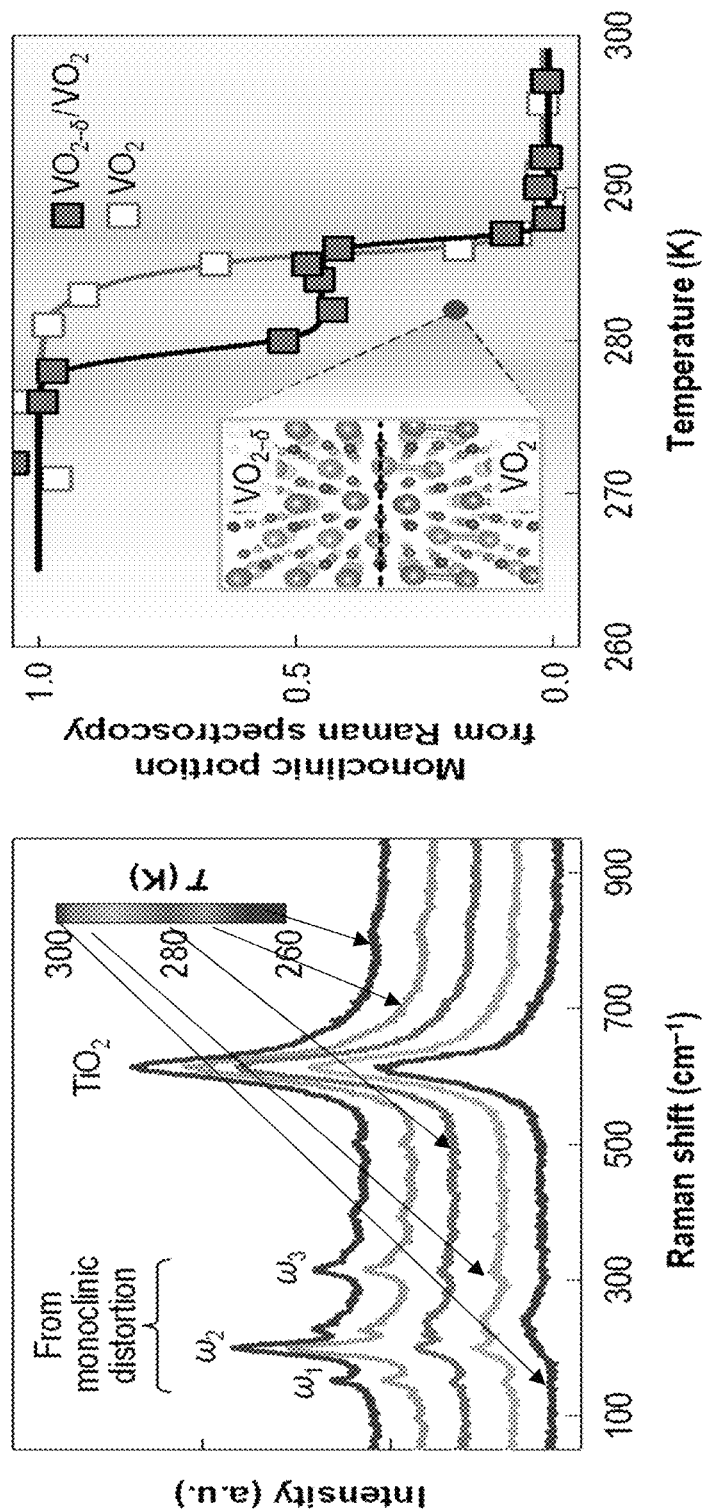

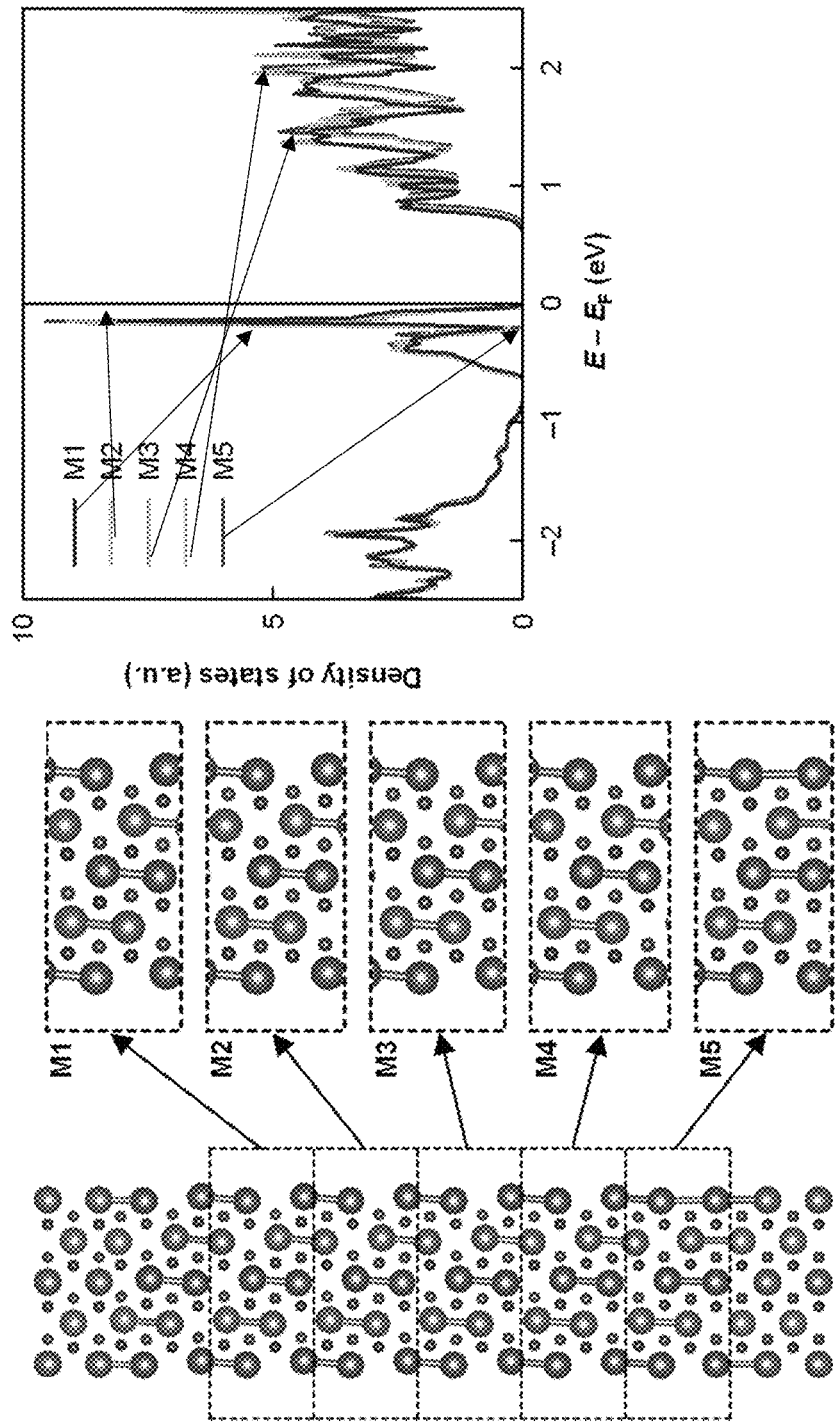

FIG. 13A
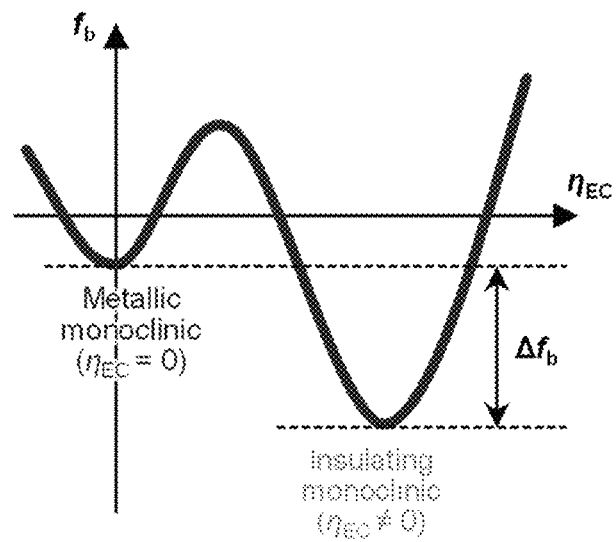
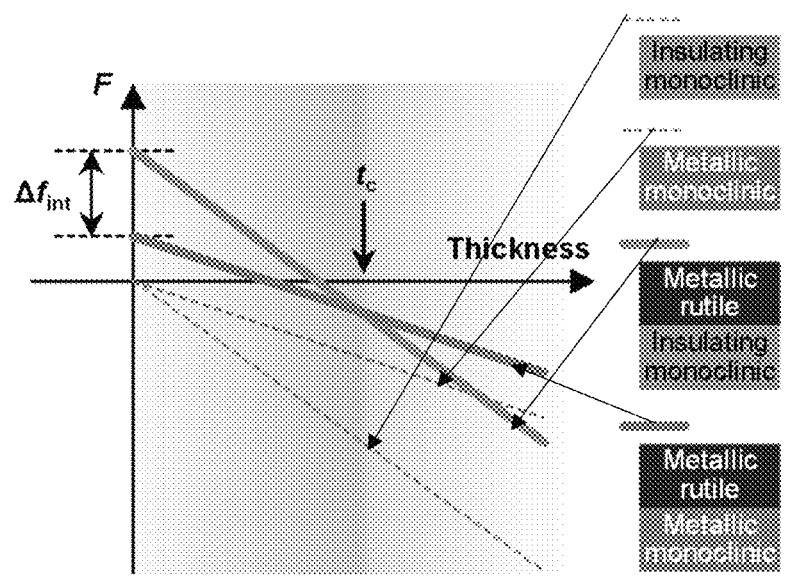
FIG. 13B

FIG. 13C
(1) $T$ = 291 K
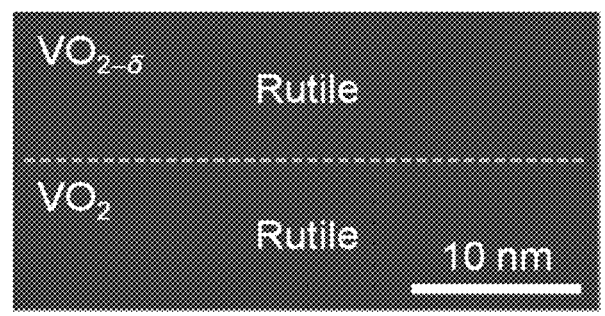
(2) 283 K
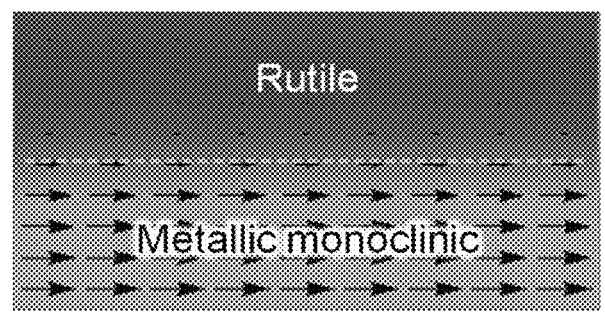
(3) 277 K
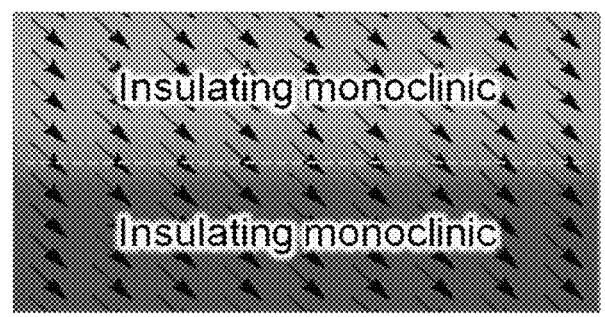
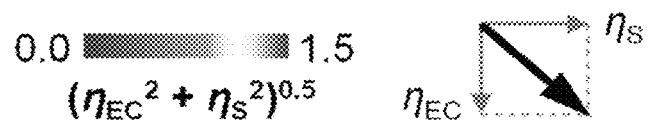

FIG. 17A
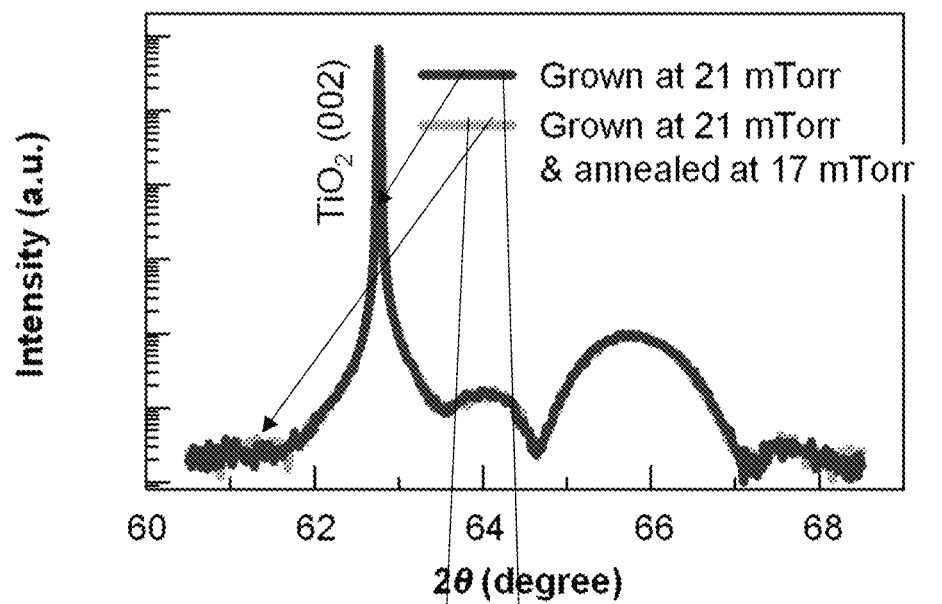
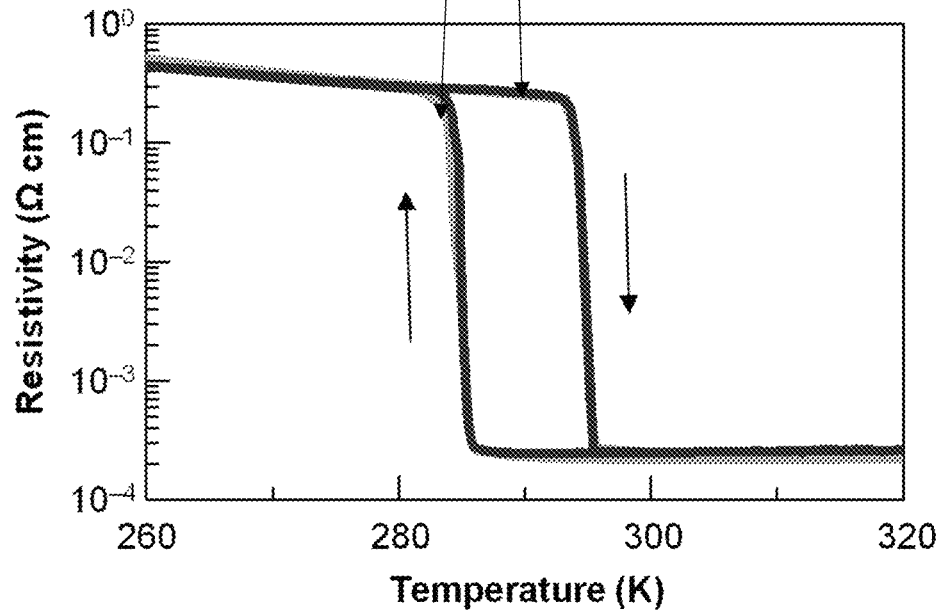
FIG. 17B

FIG. 18A
FIG. 18B
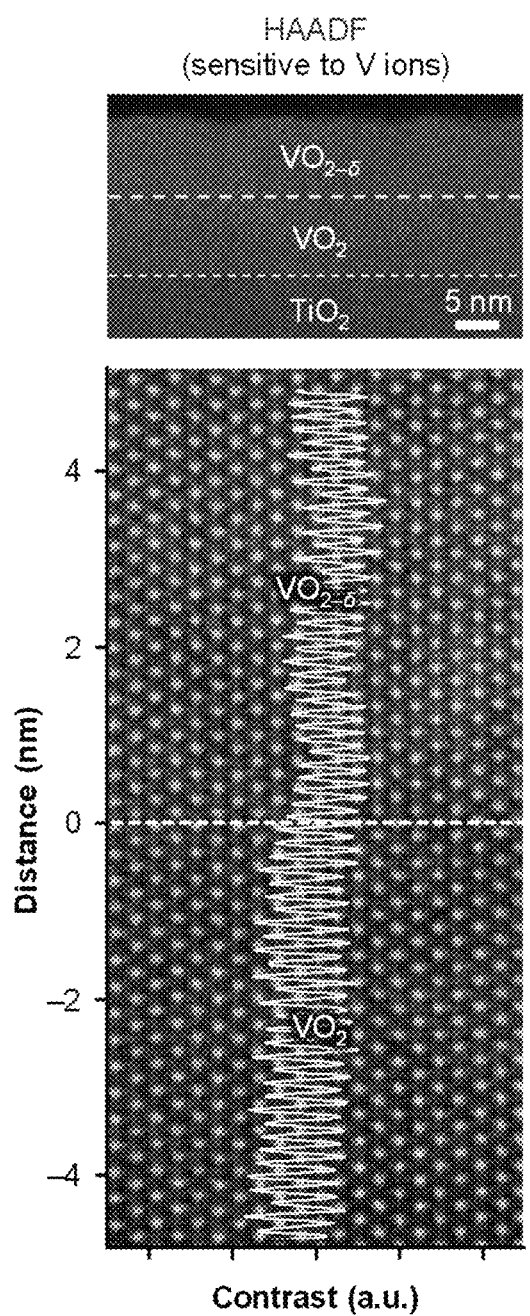
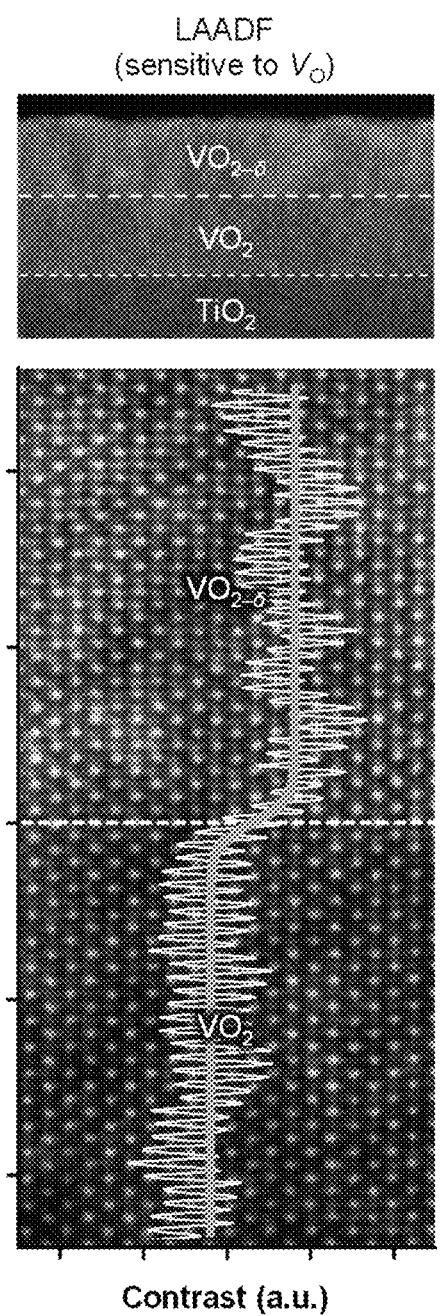

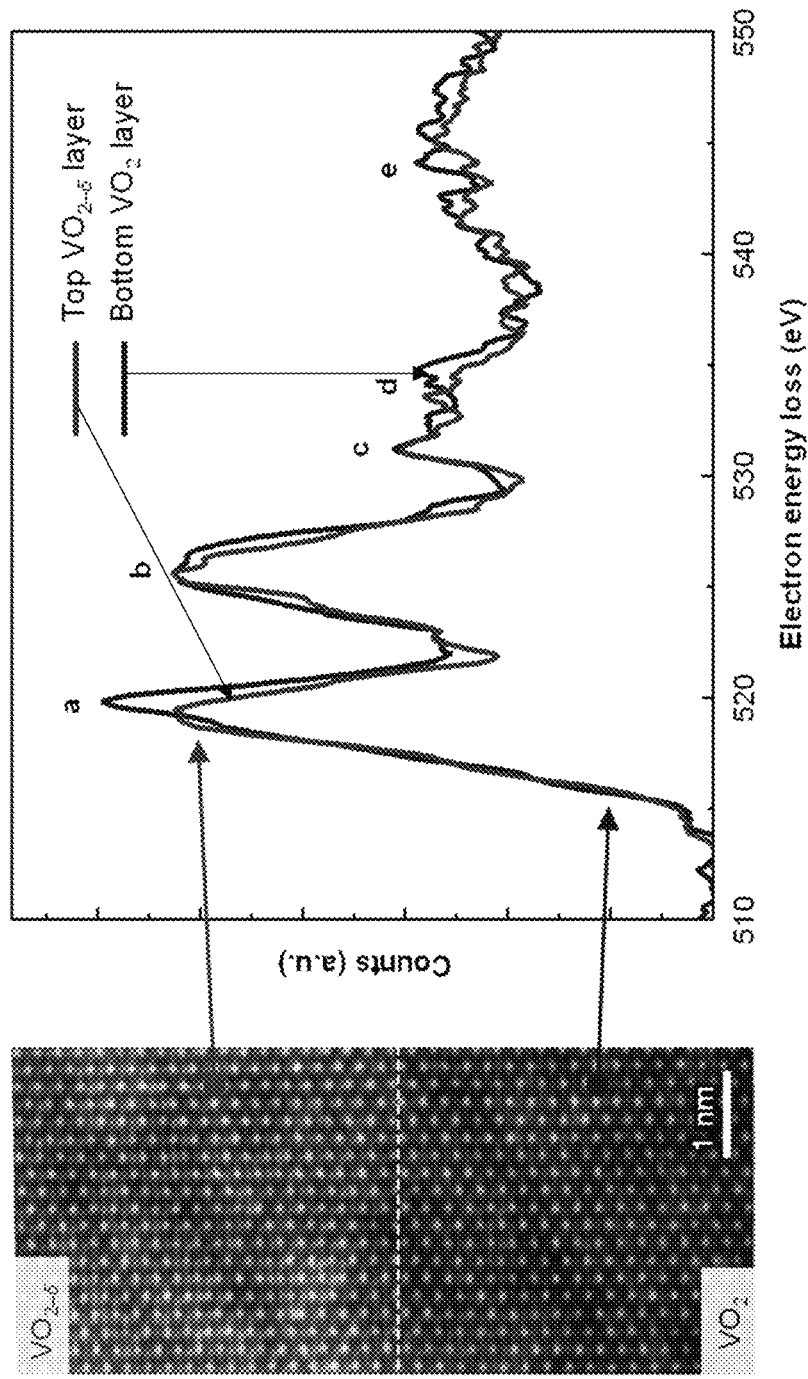

FIG. 20A
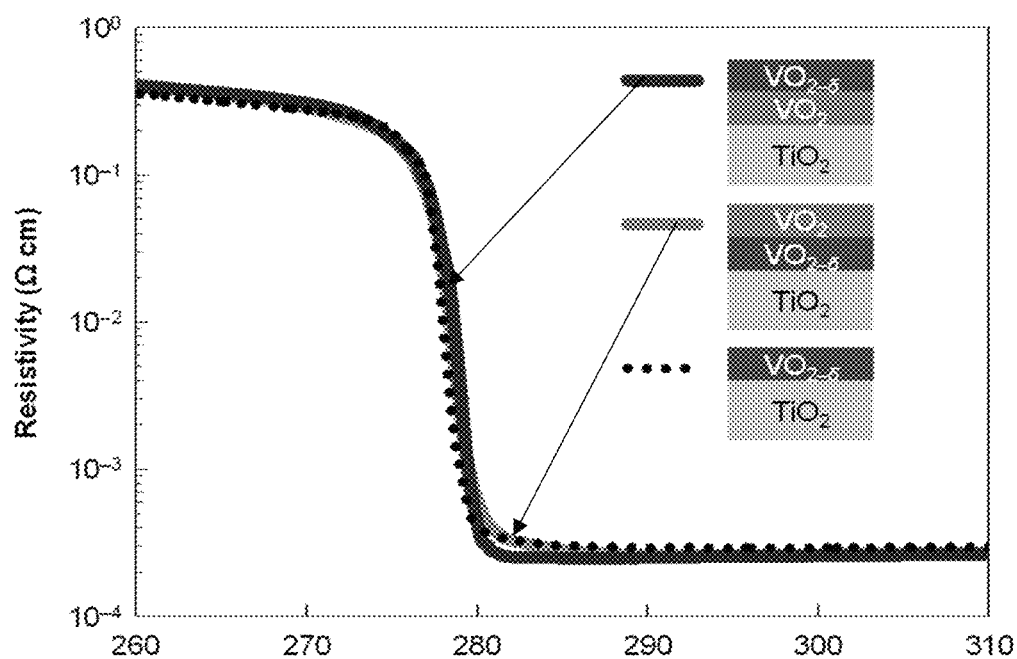
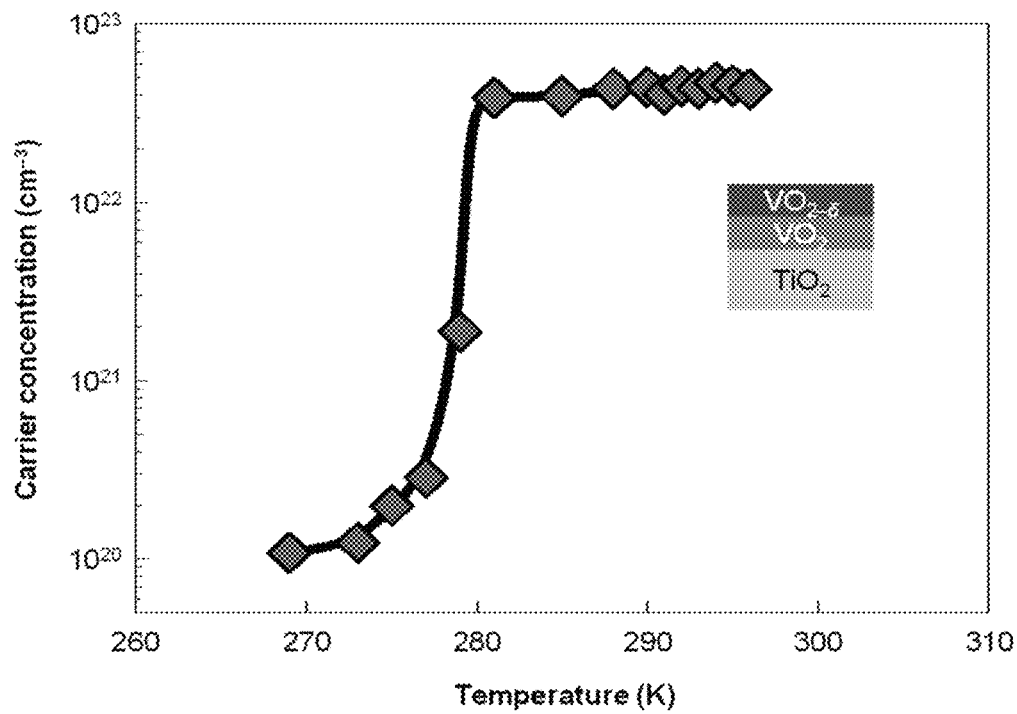
FIG. 20B

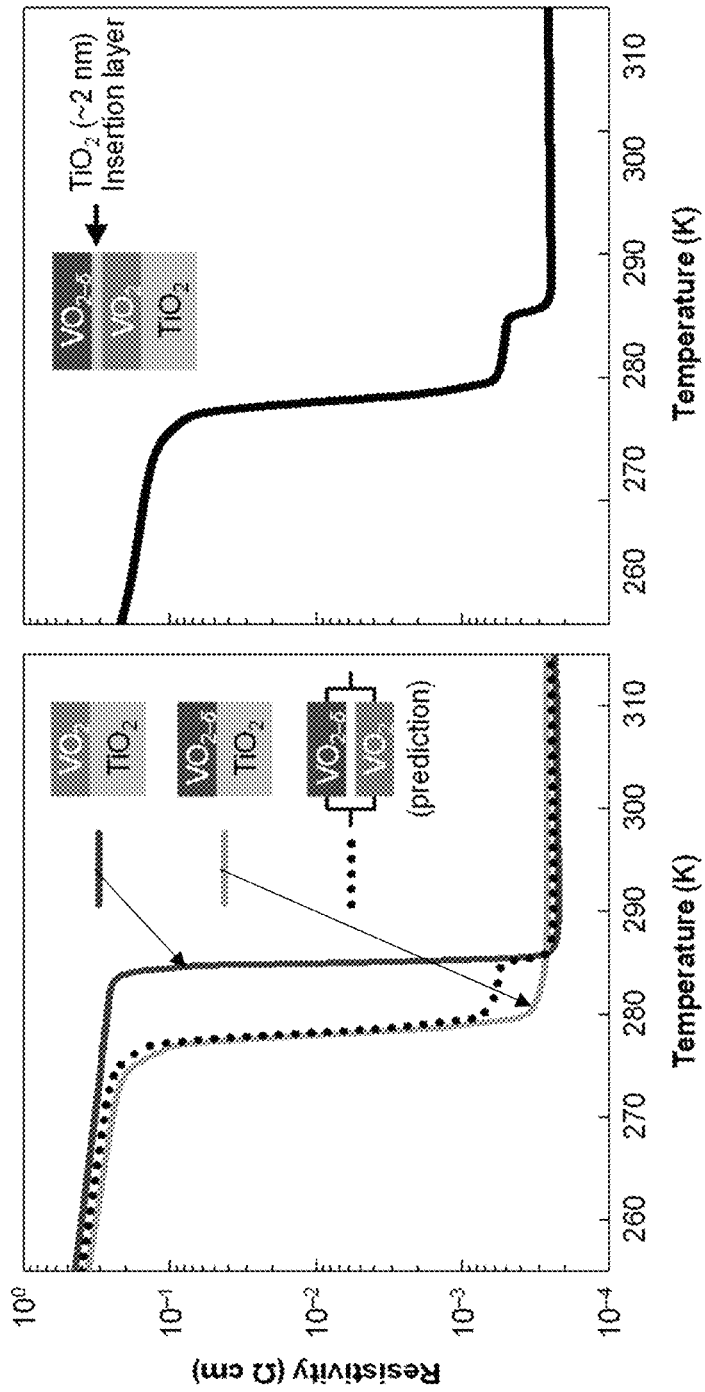

VANADIUM DIOXIDE HETEROSTRUCTURES HAVING AN ISOSTRUCTURAL METAL-INSULATOR TRANSITION

REFERENCE TO GOVERNMENT RIGHTS

This invention was made with government support under DMR-1629270 awarded by the National Science Foundation and N00014-13-1-0183 awarded by the Office of Naval Research. The government has certain rights in the invention.

BACKGROUND

Understanding metal-insulator transitions in strongly correlated materials is one of the major challenges in condensed matter physics, with implications for both fundamental science and technology. Correlated materials exhibit strong coupling between charge, spin, and lattice degrees of freedom, so that the metal-insulator transition is almost always accompanied by an associated structural phase transition. This coexistence obscures the underlying physics, making it difficult to disentangle different intrinsic interactions controlling the metal-insulator transition. Furthermore, the structural transition generally limits the ultimate switching speed and endurance of novel ultrafast electronic applications based on the metal-insulator transition in these correlated materials. A predictive guideline for achieving an isostructural metal-insulator transition is of great interest from both the fundamental and technological points of view.

$VO_2$ is an example of a correlated oxide material with a near-room-temperature metal-insulator transition (341 K in bulk). However, the transition from metallic to insulating phase in $VO_2$ is accompanied by a structural transition from the higher-symmetry rutile structure to the lower-symmetry monoclinic structure via the formation of V—V dimers. This arises from the inherently coupled electronic and structural phases of bulk $VO_2$.

SUMMARY

Heterostructures that include a bilayer composed of epitaxial layers of vanadium dioxide having different rutile-to-monoclinic structural transition temperatures are provided. Also provided are electrical switches that incorporate the heterostructures.

One embodiment of a bilayer includes: (a) a first layer of vanadium dioxide characterized in that it undergoes a rutile-to-monoclinic structural phase transition at a first structural transition temperature; and (b) a second layer of vanadium dioxide adjacent to the first layer of vanadium dioxide. The second layer of vanadium dioxide is characterized in that it undergoes a rutile-to-monoclinic structural phase transition at a second structural transition temperature that is higher than the first structural transition temperature. The bilayer may be characterized in that it undergoes a single-step metal-insulator electronic transition at an electronic transition temperature.

One embodiment of a method of inducing a single-step metal-insulator electronic transition in a bilayer of the type described herein includes: maintaining the bilayer at a temperature above the first structural transition temperature; and applying an external stimulus to the bilayer, wherein the external stimulus induces the second layer of vanadium dioxide to undergo an isostructural electronic phase transition from an electrically insulating monoclinic crystalline phase to an electrically conducting monoclinic crystalline phase.

One embodiment of an electrical switching device includes a bilayer comprising: a first layer of vanadium dioxide characterized in that it undergoes a rutile-to-monoclinic structural phase transition at a first structural transition temperature; and a second layer of vanadium dioxide adjacent to the first layer of vanadium dioxide, the second layer of vanadium dioxide characterized in that it undergoes a rutile-to-monoclinic structural phase transition at a second structural transition temperature that is higher than the first structural transition temperature. The device further includes a first electrically conducting contact in electrical communication with a first area of the bilayer; a second electrically conducting contact in electrical communication with a second area of the bilayer; and an external stimulus source configured to apply a metal-insulator transition-inducing external stimulus to the bilayer.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 4 is a schematic diagram of a field-effect switch that incorporates a vanadium dioxide bilayer.

FIGS. 5A-5F depict the emergence of stable metallic monoclinic $VO_2$ phase. FIG. 5A shows the rutile/monoclinic heterostructure used in the DFT calculation, including V atoms (rutile $VO_2$ and monoclinic $VO_2$). FIG. 5B depicts the calculated density of states of the local monoclinic region [denoted by (a) in A] in the rutile/monoclinic heterostructure. The density of states of bulk monoclinic $VO_2$ is also shown as a reference. FIG. 5C shows the free energy landscape of bulk $VO_2$ at 287 K, just below the transition temperature. FIG. 5D depicts the total energies as a function of $t_m$ in the rutile/monoclinic heterostructure FIG. 5E shows stable states of the rutile/monoclinic heterostructure for $t_m > t_c$. FIG. 5F shows stable states of the rutile/monoclinic heterostructure for $t_m < t_c$. The arrows represent the two-component order parameter ($\eta_S$, $\eta_{EC}$), and the shading represents the norm $(\eta_S^2 + \eta_{EC}^2)^{0.5}$.

FIGS. 6A-6B show the design of an artificial $VO_{2-\delta}/VO_2$ bilayer. FIG. 6A depicts electrical resistivity measured as a function of temperature of 8-nm-thick epitaxial $VO_2$ and $VO_{2-\delta}$ (roughly, $\delta \sim 0.01$) single layer films on (001) $TiO_2$ substrates. FIG. 6B shows atomic-scale imaging of oxygen vacancy profile in the $VO_{2-\delta}/VO_2$ bilayer (inset). The lines indicate measured contrast profile through atomic columns and white dashed lines represent a nominal interface between $VO_2$ and $VO_{2-\delta}$.

FIG. 7A-7E depict structural phase transition in $VO_{2-\delta}/VO_2$ bilayer. FIG. 7A shows Raman spectra of $VO_{2-\delta}$ (8 nm)/$VO_2$ (8 nm) bilayer at various temperatures. Raman peaks from the monoclinic distortion are denoted by $\omega_1$, $\omega_2$, and $\omega_3$. FIG. 7B shows the relative monoclinic portion as a function of temperature, estimated from monoclinic Raman intensity in FIG. 7A. The inset depicts a schematic for atomic structure of $VO_{2-\delta}/VO_2$ bilayer at intermediate temperatures. FIG. 7C shows an X-ray diffraction (XRD) (00L) scan around the $TiO_2$ (002) Bragg peak, measured on cooling. FIG. 7D shows representative XRD peaks at temperatures of 300, 284, and 272 K. In FIG. 7E experimental data (open circles) are fitted using Gaussian curves (solid lines). The relative monoclinic portion, as a function of temperature, is estimated from the XRD peak analysis in FIG. 7D. The insets show the measured electron diffraction patterns of the bilayer at low and high temperatures.

FIG. 8A shows electrical resistivity vs. temperature of $VO_{2-\delta}$ (8 nm)/$VO_2$ (8 nm) bilayer (solid line) and 8-nm-thick $VO_{2-\delta}$ single layer (black dashed line), measured on cooling. Metallic and insulating phases are represented by red and blue colors, respectively. FIG. 8B depicts the monoclinic portion (from FIGS. 7B and 7E) as a function of temperature. FIG. 8C shows the temperature dependence of the monoclinic Raman shift, i.e., $\omega_2$ and $\omega_3$, shown in FIG. 7A.

FIG. 9A depicts the calculated atomic structure for 6-unit-cells (including 23 planes of $VO_2$) of monoclinic $VO_2$, sandwiched by rutile $VO_2$. While the atomic positions of the two-unit-cell monoclinic region were fixed near the lower interface as bulk-like, full atomic relaxation was allowed in all other monoclinic regions. FIG. 9B shows the calculated density of states for each layer as a function of energy $E-E_F$. Gray color indicates the regions that have the density of states, lower than 0.05. The values of the V—V—V bond angle are also represented along the $[001]_{Rutile}$ axis, an indication of monoclinic distortion, for each layer by open red squares.

FIGS. 10A and 10B show the density-of-states calculation for the captured local monoclinic structure. FIG. 10A shows a local monoclinic structure (denoted by M1, M2, M3, M4, and M5) in the rutile/monoclinic superlattice, which was then used as a bulk structure for the density of states calculation. FIG. 10B shows calculated density of states for a bulk monoclinic employing the captured local monoclinic structures.

FIG. 11A shows the calculated density of states of hole-doped monoclinic $VO_2$, which shows a significant band-gap narrowing as the hole concentration increases. FIG. 11B shows the calculated density of states of electron-doped monoclinic $VO_2$, which shows a negligible band-gap narrowing as the electron concentration increases.

FIG. 12A shows the free energy landscape of bulk $VO_2$ at 287 K (left) and 292 K (right). FIG. 12B shows the temperature dependence of $\eta_S$ and $\eta_{EC}$, which make the global minimum in free energy (i.e., equilibrium phase) at each temperature.

FIGS. 13A-13C show the emergence of a stable metallic monoclinic phase. FIG. 13A is a schematic of the bulk molar Landau potential, showing the non-equilibrium (metastable) metallic monoclinic phase, as well as the equilibrium (stable) insulating monoclinic phase. FIG. 13B is a schematic of the total energy per area as a function of thickness in the rutile/monoclinic heterostructure. FIG. 13C shows stable states, calculated by phase-field simulations, of the $VO_{2-\delta}/VO_2$ bilayer for temperatures of T=291 K, 283 K, and 277 K. The arrows represent the two-component order parameter ($\eta_S$, $\eta_{EC}$), and the shading represents the norm $(\eta_S^2+\eta_{EC}^2)^{0.5}$. The thickness of each layer was set to be below $t_c$~9.4 nm.

FIG. 15A shows X-ray diffraction (XRD) 2θ-ω scans of $VO_2$ single layer, $VO_{2-\delta}$ single layer, and $VO_{2-\delta}/VO_2$ bilayer. The simulated result for $VO_{2-\delta}/VO_2$ bilayer is also represented, which is well matched with the experimental data. FIG. 15B shows the rocking curve of the XRD (002) reflection for $VO_{2-\delta}/VO_2$ bilayer. FIG. 15C shows an XRD reciprocal space map around the (112) reflections of $TiO_2$ substrate and $VO_{2-\delta}/VO_2$ bilayer. FIG. 15D is an atomic force microscopy image of $VO_{2-\delta}/VO_2$ bilayer, showing smooth surface of the film.

FIG. 16A shows the linear relationship between $r_M$ and $V^{1/3}$ in rutile oxides. FIG. 16B shows the measured unit cell volume and the estimated oxygen-vacancy concentration δ in the $VO_2$ films, as a function of oxygen partial pressure ($P_{O2}$) used during film growth.

FIGS. 17A and 17B show no effect of the "after-growth" change of $P_{O2}$. FIG. 17A shows X-ray diffraction (XRD) 2θ-ω scans of two $VO_2$ samples. One line is for the sample that was grown and cooled at $P_{O2}$=21 mTorr. Another line is for the sample that was grown at $P_{O2}$=21 mTorr, annealed for 10 minutes at a reduced $P_{O2}$=17 mTorr, and cooled at $P_{O2}$=17 mTorr. FIG. 13B shows electrical resistivity as a function of temperature for two $VO_2$ samples in FIG. 17A.

FIGS. 18A and 18B depict nanoengineered oxygen stoichiometry. FIG. 18A shows a high-angle annular dark field (HAADF) image and FIG. 18B shows a low-angle annular dark field (LAADF) image, both of which are sensitive to V atomic lattice and oxygen vacancy, respectively. Thin, solid lines indicate measured contrast profile through atomic columns and white dashed lines represent a nominal interface between $VO_2$ and $VO_{2-\delta}$.

FIGS. 19A-19C show an EELS analysis of oxygen stoichiometry. FIG. 19A is an LAADF-STEM image of a $VO_{2-\delta}/VO_2$ bilayer. FIG. 19B shows measured V-$L_{2,3}$ (a and b peaks) and O-K edges (c, d, and e peaks) for the top $VO_{2-\delta}$ and bottom $VO_2$ layers of $VO_{2-\delta}/VO_2$ bilayer. FIG. 19C shows calculated EELS data for the vanadium $L_{2,3}$ (left) and oxygen K (right) edges.

FIGS. 20A and 20B show transport measurement. FIG. 20A shows electrical resistivity as a function of temperature on cooling for $VO_{2-\delta}$ (8 nm)/$VO_2$ (8 nm) bilayer, $VO_2$ (8 nm)/$VO_{2-\delta}$ (8 nm) bilayer, and 8-nm-thick $VO_{2-\delta}$ single layer (black dotted line). FIG. 20B shows carrier concentration as a function of temperature on cooling for $VO_{2-\delta}$ (8 nm)/$VO_2$ (8 nm) bilayer. The black solid line is the guide to the eyes.

FIGS. 21A and 21B show the metal-insulator transition of the trilayer. FIG. 21A shows the predicted metal-insulator transition on cooling for the simply parallel-connected 8-nm-thick $VO_{2-\delta}$ and 8-nm-thick $VO_{2-\delta}$ layers without any interfacial interaction. FIG. 21B shows measured metal-insulator transition on cooling for the $VO_{2-\delta}$ (8 nm)/$TiO_2$ (2 nm)/$VO_2$ (8 nm) trilayer.

DETAILED DESCRIPTION

Figure 1:
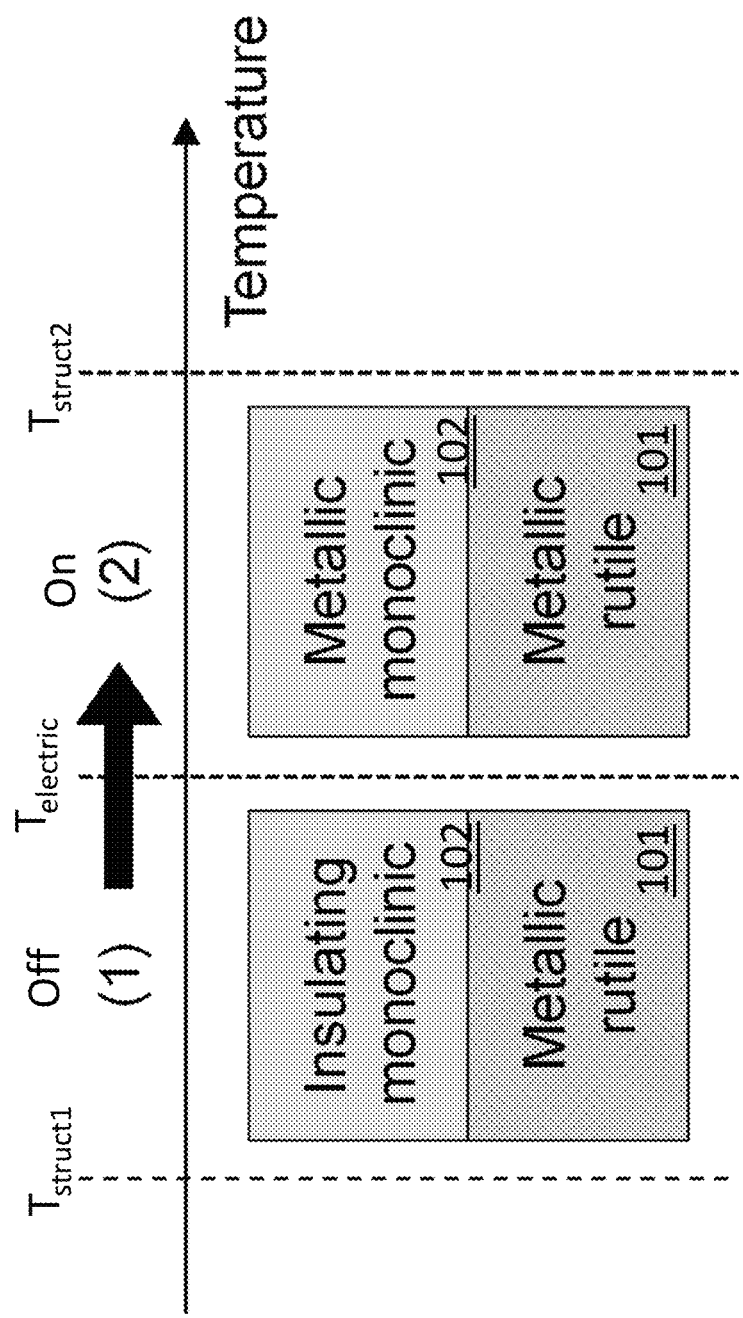
FIG. 1 is a schematic diagram showing the off-on switching of a vanadium dioxide bilayer.

Heterostructures that include a bilayer composed of epitaxial layers of vanadium dioxide having different rutile-to-monoclinic structural transition temperatures are provided. Also provided are electrical switches that incorporate the heterostructures. The bilayers are characterized in that they undergo a single-step, collective, metal-insulator transition at an electronic transition temperature, $T_{electric}$. At temperatures below $T_{electric}$, the layer of vanadium dioxide having the higher structural transition temperature comprises an insulating monoclinic crystalline phase, which is converted to a metallic monoclinic crystalline phase at temperatures above $T_{electric}$. Because $T_{electric}$ can be close to room temperature, the bilayers are well-suited for near room temperature switching applications.

In the bilayers, the first of the two layers of vanadium dioxide is engineered to have a lower structural transition temperature than the second of the two layers. This can be accomplished by extrinsically doping the vanadium dioxide or introducing oxygen vacancies in the vanadium dioxide of the first layer. The vanadium dioxide bilayers may be grown epitaxially on a growth substrate, such as a TiO$_2$ substrate, beginning with a stoichiometric layer of VO$_2$ upon which an extrinsically-doped or oxygen-deficient layer of vanadium dioxide is grown. Extrinsic dopants that can be introduced into the vanadium dioxide in order to lower its structural transition temperature include metal dopants, such as tungsten, molybdenum, chromium, and niobium. A typical dopant concentration is $0.01 \leq x \leq 0.1$ for the doped vanadium dioxide, $V_{1-x}M_xO_2$. Alternatively, oxygen vacancies can be introduced into the vanadium dioxide to produce non-stoichiometric, oxygen-deficient $VO_{(2-\delta)}$ by carrying out epitaxial growth under a reduced oxygen partial pressure. By way of illustration only, in some embodiments of the bilayers, $\delta$ is in the range from about 0.005 to 0.02.

For the purposes of this disclosure the term vanadium dioxide refers to stoichiometric VO$_2$ and also to non-stoichiometric, extrinsically doped vanadium dioxide ($V_{(1-x)}D_xO_2$), in which dopant atoms (D) are substituted for a portion of the vanadium atoms, and also to non-stoichiometric, oxygen-deficient vanadium dioxide comprising oxygen vacancies ($VO_{(2-\delta)}$).

The resulting extrinsically doped or oxygen-deficient $VO_{(2-\delta)}$ is characterized in that it undergoes a rutile-to-monoclinic structural phase transition at a lower structural transition temperature than does stoichiometric VO$_2$. This produces a two-step structural phase transition in the bilayer. Like the single-step, collective, electronic phase transition, the structural phase transitions can occur at temperatures near room temperature. For example, in some embodiments of the bilayers, the electronic transition temperature is in the range from about 274 K to about 284 K, the rutile-to-monoclinic structural phase transition for the first layer of vanadium dioxide is in the range from about 274 K to about 284 K, and the rutile-to-monoclinic structural phase transition for the second layer of vanadium dioxide is in the range from about 282 K to about 292 K. (Unless otherwise indicated, the structural and electronic phase transition temperatures referred to in this disclosure refer to the transition temperatures in the absence of an applied external field or strain.)

Without intending to be bound to any particular theory of the invention, it is proposed that the isostructural electronic transition in the monoclinic vanadium dioxide can be attributed to an interfacial energy contribution in the bilayer that stabilizes a non-equilibrium metallic monoclinic crystalline phase. Because the metal-insulator electronic phase transition of the bilayer is not accompanied by a rutile-to-monoclinic structural phase transition, switches incorporating the bilayers can have improved electronic switching speeds and durabilities, relative to switches in which the electronic metal-insulator transition is the result of a rutile-to-monoclinic phase change. In order to stabilize the metallic monoclinic phase in the bilayer, the layer of vanadium dioxide that undergoes the isostructural electronic transition should be sufficiently thin that the interfacial energy contribution dominates the bulk energy contribution in the structure, as discussed in detail in the Example. Embodiments of the bilayers include those in which the layer of vanadium dioxide having the higher rutile-to-monoclinic structural transition temperature has a thickness of less than 10 nm, including a thickness of less than 9.5 nm. In some embodiments of the bilayers, both layers meet these thickness criteria.

The vanadium dioxide bilayers can be characterized by sharp, single-step metal-insulator electronic phase transitions, where the sharpness of a transition is characterized by the full width at half maximum (FWHM) of the derivative curve of a heating curve. Some embodiments of the bilayers have an electronic phase transition sharpness of 3 K or less. This includes bilayers having an electronic phase transition sharpness of 2 K or less, and further includes bilayers having an electronic phase transition sharpness of 1 K or less. The electronic phase transition is accompanied by a large drop in the bilayer's magnitude of electrical resistance ($\Delta R$). Some embodiments of the bilayers have a $\Delta R$ of at least 2 orders of magnitude. This includes bilayers having a $\Delta R$ of at least 3 orders of magnitude, and further includes bilayers having a $\Delta R$ of at least 4 orders of magnitude.

The bilayers can be incorporated into multilayered device structures having three or more layers, wherein the additional layers may be composed of vanadium dioxide or other materials. For example, a bilayer may be part of a trilayer structure in which the layer of vanadium dioxide having a lower structural phase transition temperature is sandwiched between a pair of vanadium dioxide layers having a higher structural transition temperature, or vice versa. The layers in the bilayer or multilayer structures need not have the same shape or dimensions and a given layer need not completely cover the surface of its adjacent layer(s) in the structure. Thus, the individual layers that make up the bilayer and the overall shape of the bilayer may take on a variety of geometries, provided that the two layers that make up the bilayer form an interface that is capable of stabilizing a metallic monoclinic crystalline phase within the bilayer.

A schematic diagram illustrating the operation of a bilayer as a thermally activated switch is provided in FIG. 1. Initially, the switch is in an off-state (1) at an operating temperature above the structural transition temperature of the first layer of vanadium dioxide 101 ($T_{Struct1}$), but below the bilayer's electronic transition temperature ($T_{electric}$). In the off-state, the second layer of vanadium dioxide 102 comprises an insulating monoclinic crystalline phase. The switch can be converted into its on-state (2) by heating the bilayer to a second operating temperature that is above $T_{Struct}$ and also above $T_{electric}$. In the on-state, second layer of vanadium dioxide 102 comprises a metallic monoclinic crystalline phase. In a reverse switching cycle, the bilayer can be cooled from the second operating temperature to a temperature below $T_{electric}$, but above $T_{Struct1}$ to return the switch to its off-state.

Although the switching of a bilayer is illustrated with respect to a thermally-activated switch in FIG. 1, other means of activation can be used. That is, external stimuli, other than heating and cooling, can be used to induce the bilayer's electronic phase transition. For example, an electric field, an optical field, a mechanical strain, or a combination thereof, can be applied to the bilayer to induce the electronic phase transition by shifting $T_{electric}$. These stimuli can be applied using a temperature modulator, a voltage source, a light source, or a stain modulator, each configured to apply its respective stimulus to the bilayer.

The bilayers can be incorporated into a variety of electrical switching structures, including capacitors, planar switches, and field effect switches, for a variety of switching applications. For example, the bilayers can be used in circuits, including integrated circuits, for memory devices (e.g., CMOS chips) and communication devices. In each of these devices, the conversion of the bilayer from its electrically insulating to its electrically conducting metallic state, and vice versa, changes the resistance (and, therefore, conductance) of the bilayer, thereby modulating the device's current flow or capacitance. One embodiment of a parallel plate capacitor is shown schematically in FIG. 2. The capacitor includes three layers of vanadium dioxide on a support substrate 201, wherein a middle layer of vanadium dioxide 202 is sandwiched between two other layers of vanadium dioxide 204, 206. Middle layer 202 has a higher rutile-to-monoclinic structural transition temperature than layers 204 and 206 and the three-layered structure undergoes a single-step, collective, metal-insulator transition at some electronic transition temperature. When the capacitor is maintained at a temperature above the structural transition temperature of the outer vanadium dioxide layers 204, 206, those layers will comprise metallic rutile vanadium dioxide and, therefore, can act as electrically conductive (metallic) electrodes for the capacitor. When the capacitor is at a temperature below its electronic transition temperature, vanadium dioxide layer 202 is in an electrically insulating state, the device has a high capacitance, and charges build up on outer vanadium dioxide layers 204 and 206. However, when an electronic phase transition-inducing stimulus is applied to the capacitor, converting the vanadium dioxide layer 202 into its metallic state, the capacitance of the device drops and outer vanadium dioxide layers 204 and 206 are able to discharge through layer 202. The stimulus may be, for example, a voltage applied across the structure by a voltage source connected between vanadium dioxide layers 204 and 206.

Figure 3:
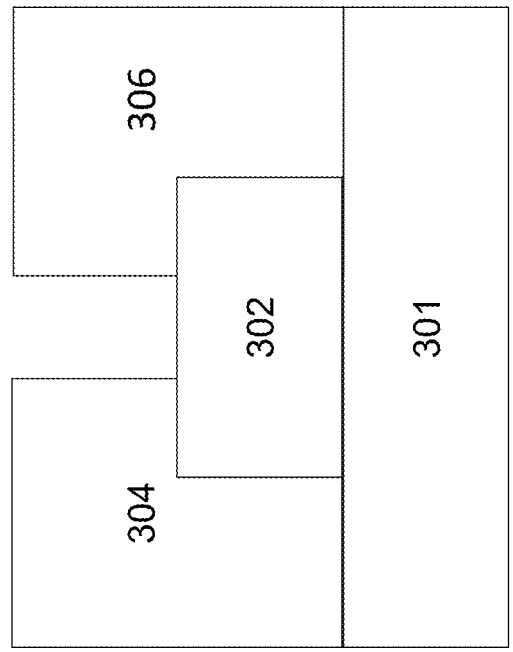
FIG. 3 is a schematic diagram of a planar switch that incorporates a vanadium dioxide bilayer.

One embodiment of a planar switch is shown schematically in FIG. 3. The switch includes a channel layer of vanadium dioxide 302 bridging a first contact layer of vanadium dioxide 304 and a second contact layer of vanadium dioxide 306 on a support substrate 301. First and second contact layers 304 and 306 have a lower rutile-to-monoclinic structural transition temperature than channel layer 302. When the switch is maintained at a temperature above the structural transition temperature of first and second contact layers 304 and 306, those layers will comprise metallic rutile vanadium dioxide and, therefore, can act as electrically conductive (metallic) electrodes for the switch. When the switch is at a temperature below its electronic transition temperature, the vanadium dioxide of channel layer 302 is in an electrically insulating monoclinic phase and current is unable to flow between first and second contact layers 304 and 306. However, when an electronic phase transition-inducing stimulus is applied to the switch, converting vanadium dioxide layer 302 into a metallic monoclinic state, the switch is turned on and current is able to flow between the contact layers. The stimulus may be, for example, a voltage applied across the structure by a voltage source connected between vanadium dioxide contact layers 304 and 306.

FIG. 4 is a schematic diagram of one embodiment of a three-terminal field effect switch. The switch includes a source 412, a drain 414, and a channel layer comprising vanadium dioxide 402 disposed between source 412 and drain 414. A gate stack comprising a gate dielectric 416 and a gate contact 418 is disposed on channel layer 402. A second layer of vanadium dioxide 404 underlies channel layer 402. The second layer of vanadium dioxide 404 has a lower rutile-to-monoclinic structural transition temperature than channel layer 402. The field effect switch also includes a dielectric substrate 407. When the switch is at a temperature below its electronic transition temperature, the vanadium dioxide of channel layer 402 is in an electrically insulating monoclinic phase and current is unable to flow between source 412 and drain 414. However, when a gate voltage is applied to gate contact 418, the vanadium dioxide of channel layer 402 is converted into a metallic monoclinic phase, the switch is turned on and current is able to flow between the source and the drain.

Figure 2:
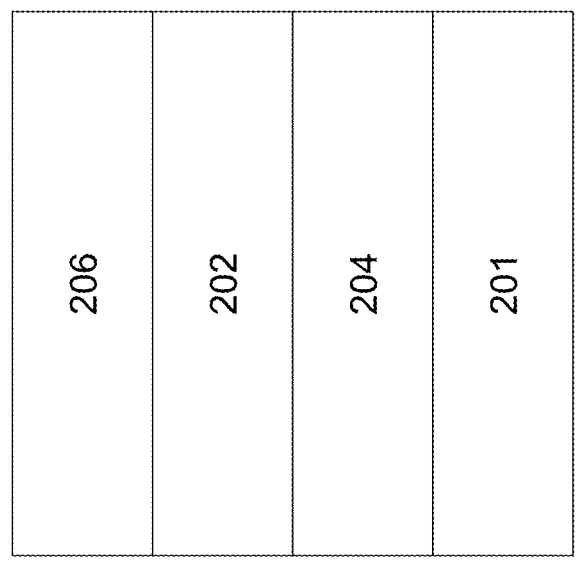
FIG. 2 is a schematic diagram of a parallel plate capacitor that incorporates a vanadium dioxide trilayer.

In the switching devices of FIGS. 2-4, the vanadium dioxide layer having the lower structural transition temperature can be composed of, for example, tungsten-doped vanadium dioxide and the vanadium dioxide layer having the higher structural transition temperature can be composed of, for example, stoichiometric $VO_2$. In some embodiments of the bilayers, both layers can be extrinsically doped, provided that the first layer retains a lower rutile-to-monoclinic phase transition than the second layer.

EXAMPLE

This example demonstrates a purely electronically-driven metal-insulator transition that keeps the crystalline structure of vanadium dioxide ($VO_2$). A general framework is proposed for stabilizing a metallic monoclinic phase and demonstrating the reversible phase transition between the metallic and insulating monoclinic phases in $VO_2$.

$VO_2$ displays intrinsic phase coexistence in the vicinity of phase transition. Based on this, a heterostructure was conceived between the rutile and monoclinic phases (FIG. 5A), where electronic correlations and the interfacial energy would favor the metallic monoclinic phase. The first-principles density functional theory (DFT) calculations predicted the metallic nature of the monoclinic layer in the rutile/monoclinic heterostructure (FIG. 5B), distinct from the insulating nature of the bulk monoclinic $VO_2$. Inside the monoclinic region, the electronic structure was strongly modified, resulting in significant band gap narrowing. This was largely driven by the hole doping of the monoclinic region (FIG. 5B), stemming from the different work functions of the rutile and monoclinic phases. This hole doping reduced electronic correlations, causing a complete collapse of the band gap in monoclinic $VO_2$. Simultaneously, the DFT results implied that the rutile/monoclinic heterostructure had a very small interfacial energy, which may also have played a role in stabilizing the metallic monoclinic phase.

To explore the effects of electronic correlations and interfacial energy, a generalized Landau thermodynamic approach was implemented in phase-field modeling. FIG.

5C shows the predicted phase diagram of bulk $VO_2$ at just below the transition temperature. This was based on two different order parameters: $\eta_S$ describing the structural transition [i.e., from rutile ($\eta_S=0$) to monoclinic ($\eta_S=1$) phase]; and $\eta_{EC}$ describing the electronic correlations, which controls metal-insulator transition [i.e., from metal ($\eta_{EC}=0$) to insulator ($\eta_{EC}=1$)]. Only two bulk equilibrium phases were found: the metallic rutile phase with little electronic correlation ($\eta_S=\eta_{EC}=0$) at high temperatures; and the correlated insulating monoclinic phase ($\eta_S=\eta_{EC}=1$) at low temperatures. This indicated that in a bulk crystal, the electronic and structural phase transitions always took place simultaneously at the same temperature, consistent with the conventional understanding of this material. However, in addition to these bulk equilibrium phases, the presence of a non-equilibrium metallic monoclinic phase was predicted with suppressed correlation ($\eta_S=1$ and $\eta_{EC}=0$), as represented by the local minimum in the Landau potential (FIG. 5C). If this metallic monoclinic phase could be stabilized, rather than just being transient, an isostructural metallic transition could be achieved in correlated insulating monoclinic $VO_2$.

In the rutile/monoclinic heterostructure, the metallic monoclinic phase was stabilized by the interfacial energy contribution. FIG. 5D shows the total energy of the rutile/monoclinic heterostructure, obtained by phase-field simulations, as a function of the thickness t of the monoclinic layer. The interfacial energy between metallic rutile and metallic monoclinic phases was naturally smaller to that between metallic rutile and insulating monoclinic phases in the phase-field model, due to the homogeneous $\eta_{EC}$ in the former case. When $t_m$ was below critical thickness $t_c$, the interfacial energy contribution dominated over the bulk energy contribution and, as a result, the metallic monoclinic phase with suppressed correlation (i.e., $\eta_{EC}=0$) became energetically preferred and stabilized. $t_c$ was estimated to be around 9.4 nm, using phase-field simulations that clearly manifested the reversed stability between insulating and metallic monoclinic phases for $t_m>t_c$ (FIG. 5E) and $t_m<t_c$ (FIG. 5F). Thus, theoretical modeling predicted a stabilized metallic monoclinic phase in the rutile/monoclinic heterostructure, without necessity of non-equilibrium conditions.

Based on theoretical predictions, a nanoscale bilayer composed of two $VO_2$ layers was designed with different transition temperatures (namely, $T_1$ and $T_2$; FIG. 6A). In this bilayer, the rutile/monoclinic heterostructure can occur at intermediate temperatures between $T_1$ and $T_2$. To experimentally control the transition temperature in $VO_2$, an intrinsic point defect was utilized, i.e., oxygen vacancy and the resulting electron doping. Introducing a minute amount of oxygen vacancies enabled the lowering of the transition temperature of $VO_2$ without compromising the sharp metal-insulator transition. (See, Griffiths, C. H., et al., Influence of stoichiometry on the metal-semiconductor transition in vanadium dioxide. *J. Appl. Phys.* 45, 2201-2206 (1974).) By changing the oxygen partial pressure during film growth, an artificial bilayer was prepared (inset in FIG. 6B), fully coherent on $TiO_2$ (001) substrate, composed of slightly oxygen-deficient $VO_{2-\delta}$ and stoichiometric $VO_2$ layers. Each $VO_{2-\delta}$ and $VO_2$ layer had the transition temperature of $T_1\sim279$ K and $T_2\sim287$ K, respectively (FIG. 6A), and the thickness was set to be around 8 nm, i.e., below the estimated $t_c\sim9.4$ nm.

To visualize the oxygen vacancy profile in the bilayer, atomic-scale imaging was performed using scanning transmission electron microscopy (STEM). In STEM, the low angle annular dark field (LAADF) image is very sensitive to the strain fields from oxygen vacancies, while the high angle annular dark field (HAADF) image is dominated by the (high-Z) cation sites. The HAADF image (left in FIG. 6B) obtained showed little intensity change across the $VO_{2-\delta}$/$VO_2$ interface (denoted by white dashed lines). In contrast, the LAADF image (right in FIG. 6B) displayed a noticeable, abrupt intensity change across the $VO_{2-\delta}$/$VO_2$ interface, making the oxygen deficiency in the $VO_{2-\delta}$ layer visible. This result emphasizes that introducing a small amount of oxygen vacancies, rather than extrinsic dopants, creates a chemically sharp interface with a sub-1-nm width and allows a quasi-homogeneous, single crystalline feature of the bilayer. Considering this nanoengineered oxygen vacancy profile, two distinct transition temperatures are expected in the top $VO_{2-\delta}$ and bottom $VO_2$ layers.

Figure 7E:
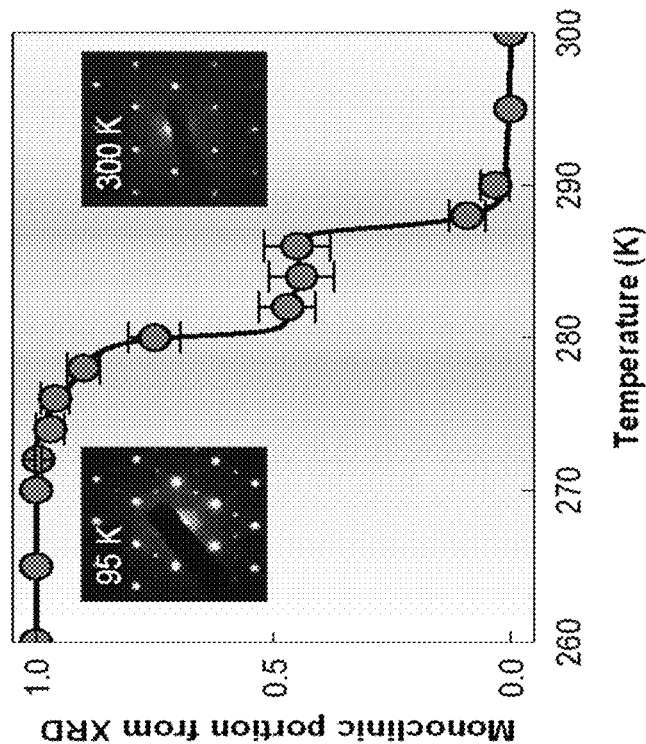

Using Raman spectroscopy, the structural phase transition was monitored in the $VO_{2-\delta}$/$VO_2$ bilayer (FIGS. 7A and 7B). With decreasing temperature, several noticeable Raman peaks (e.g., $\omega_1$, $\omega_2$, and $\omega_3$ peaks in FIG. 7A) arose suddenly from the monoclinic distortions during the structural transition. Quantitative analysis (FIG. 7B) clearly showed the two-step structural phase transition in the $VO_{2-\delta}$/$VO_2$ bilayer, contrary to the single-step transition in a $VO_2$ single layer. Temperature-dependent X-ray diffraction measurements (FIGS. 7C and 7D) and phase-field simulations further confirmed the two-step structural phase transition in the bilayer. This two-step structural phase transition can be explained by two separate structural transitions, i.e., at T~279 K for the top $VO_{2-\delta}$ layer and at T~287 K for the bottom $VO_2$ layer. At intermediate temperatures between T~279 K and 287 K (as shown in FIGS. 7B and 7E), the top $VO_{2-\delta}$ and bottom $VO_2$ layers have rutile and monoclinic structures, respectively, which forms the desired rutile/monoclinic heterostructure, as illustrated in the inset of FIG. 7B.

The electronic phase transition in the $VO_{2-\delta}$/$VO_2$ bilayer was explored by measuring the electrical resistivity (FIG. 8A) and carrier concentration. In stark contrast to the two-step structural transition, the bilayer showed a single-step, collective metal-insulator transition at T~279 K. The electronic phase transition of the bilayer looked nearly identical to that of a $VO_{2-\delta}$ single layer (black dotted line in FIG. 8A), which means that in the $VO_{2-\delta}$/$VO_2$ bilayer, the electronic phase (i.e., metallic or insulating) of the $VO_2$ layer collectively followed that of the $VO_{2-\delta}$ layer. Notably, when an ultrathin (~2 nm) $TiO_2$ layer was inserted between $VO_{2-\delta}$ and $VO_2$, the $VO_{2-\delta}$/$TiO_2$/$VO_2$ system exhibited only a two-step metal-insulator transition. This confirmed the intrinsic effect of the rutile/monoclinic interface behind the observed single-step, collective metal-insulator transition in the $VO_{2-\delta}$/$VO_2$ bilayer.

Figure 8A:
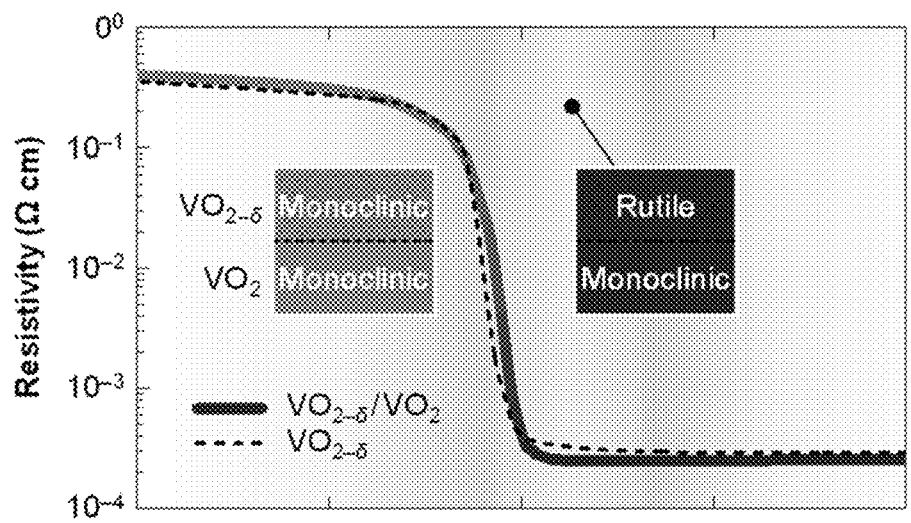
FIGS. 8A-8C depict isostructural metal-insulator transition in $VO_{2-\delta}/VO_2$ bilayer.
Figure 8B:
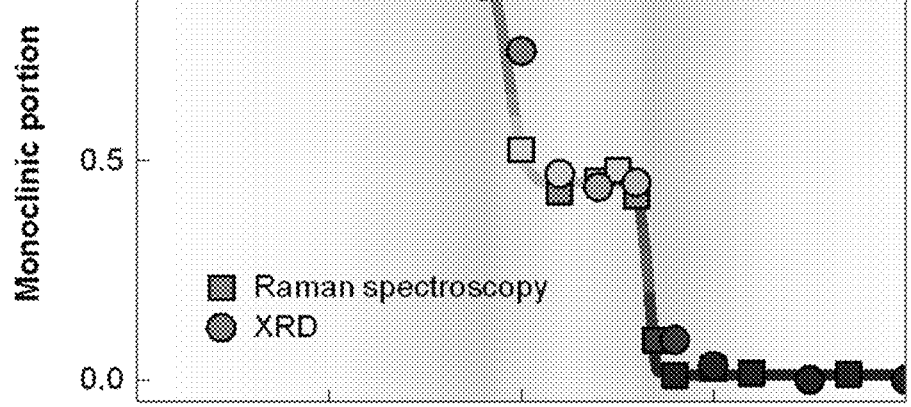
Figure 8C:
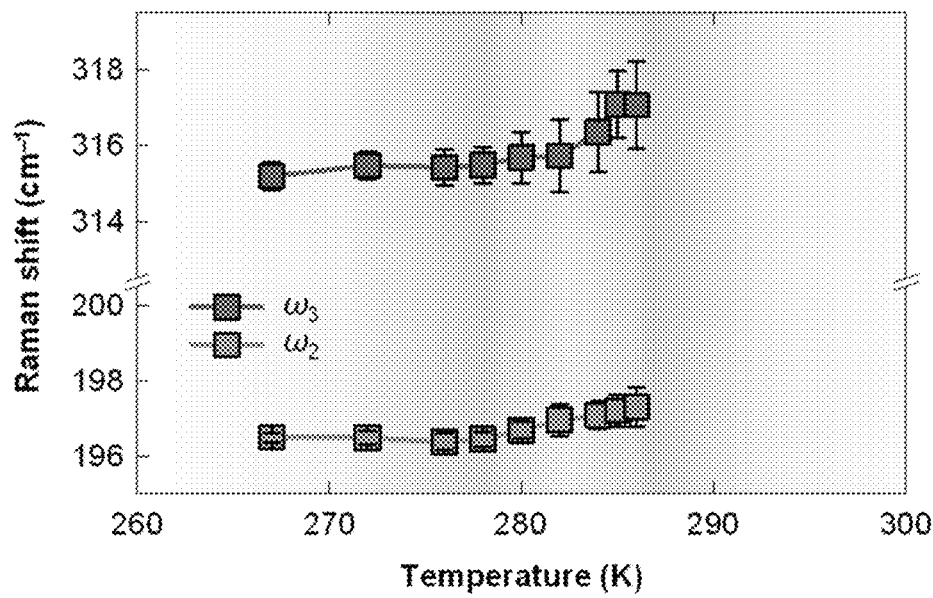

Taken together, these observations of the two-step structural and single-step electronic phase transitions unambiguously confirmed the emergence of a stable metallic monoclinic phase in the $VO_{2-\delta}$/$VO_2$ bilayer. With the decrease in temperature, the bottom $VO_2$ layer exhibited the rutile-to-monoclinic structural transition at T~287 K (FIG. 8B), but global metallicity of the whole bilayer remained unchanged (FIG. 8A). This explained that when interfaced with the metallic rutile $VO_{2-\delta}$ layer, the bottom $VO_2$ layer became a stable metallic monoclinic phase. This played a decisive role in the single-step metal-insulator transition, in agreement with the theoretical prediction (FIG. 5F). Importantly, FIG. 8C shows little change in the peak positions of $\omega_2$ and $\omega_3$, attributed to the ionic motion of V—V dimers, during the metal-insulator transition at ~279 K. This directly illustrates the isostructural metal-insulator transition without lattice distortion at ~279 K in the bottom stoichiometric $VO_2$ layer.

It is noteworthy that this isostructural metal-insulator transition has been achieved in device-relevant thin-film geometries of genuine $VO_2$, neither under non-equilibrium conditions nor limited by surface states. It is concluded that artificial stabilization of a non-equilibrium electronic phase is an effective way to realize exceptionally rare isostructural, purely electronically-driven metal-insulator transitions in correlated materials.

Materials and Methods

Density Functional Calculation

The calculations were performed using density functional theory (DFT) as implemented in Vienna ab initio simulation package (VASP). (See, G. Kresse, et al., From ultrasoft pseudopotentials to the projector augmented-wave method. *Phys. Rev. B* 59, 1758-1775 (1999); G. Kresse, et al., Efficient iterative schemes for ab initio total-energy calculations using a plane-wave basis set. *Phys. Rev. B* 54, 11169-11186 (1996).) The projected augmented wave (PAW) method was used to approximate the electron-ion potential. (See, P. E. Blöchl, Projector augmented-wave method. *Phys. Rev. B* 50, 17953-17979 (1994).) To treat exchange and correlation effects, the local density approximation (LDA) was used within the semi-empirical+Hubbard U (LDA+U) approach and a rotationally invariant formalism, for a better description of the localized transition metal d electrons. (See, J. P. Perdew, et al., Self-interaction correction to density-functional approximations for many-electron systems. *Phys. Rev. B* 23, 5048-5079 (1981); V. I. Anisimov, et al., First-principles calculations of the electronic structure and spectra of strongly correlated systems: the LDA+U method. *J. Phys. Condens. Matter* 9, 767-808 (1997); Z. Zhu, et al., Comprehensive picture of $VO_2$ from band theory. *Phys. Rev. B* 86, 075149 (2012); S. L. Dudarev, et al., Electron-energy-loss spectra and the structural stability of nickel oxide: An LSDA+U study. *Phys. Rev. B* 57, 1505-1509 (1998).) Here, $U_d$=3.8 eV and $J_d$=0.8 eV were used for the rutile structure's V-3d orbitals and $U_d$=4.63 eV and $J_d$=0.7 eV for the monoclinic structure's V-3d orbitals to produce the correct ground state phase. $3s^23p^63d^34s^2$ and $2s^22p^4$ valence electron configurations were used for vanadium and oxygen, respectively. For the relaxation of the internal co-ordinate, used ionic convergence criterion of 10.011 eV/A were used with a plane-wave cutoff energy of 500 eV (for rutile and monoclinic bulks, and rutile/monoclinic superlattice). F-centered k-mesh of 6×3×1 was employed in tetrahedron method with Blöchl corrections.

For heterostructure, 1×2×10 [(rutile)$_5$/(monoclinic)$_5$] supercell was used. To describe relaxed and abrupt $(001)_{Rutile}$ interfaces in the heterostructure, seven and eight layers of rutile and monoclinic phases near the abrupt interface, respectively, were fixed. The in-plane lattice parameter was fixed, while the out-of-plane lattice parameter and the internal co-ordinates were relaxed. The in-plane lattice parameter, a=b=4.5446 Å, was used, and the out-of-plane lattice parameters, 2.8512 Å and 5.5300 Å, were used for rutile and monoclinic layers, respectively. After the relaxation of superlattices, two layers of the rutile phase near the relaxed interface showed the dimerization of V—V—V, resembling a monoclinic phase and out-of-plane lattice parameter was 41.707 Å.

Figures 9A, 9B:
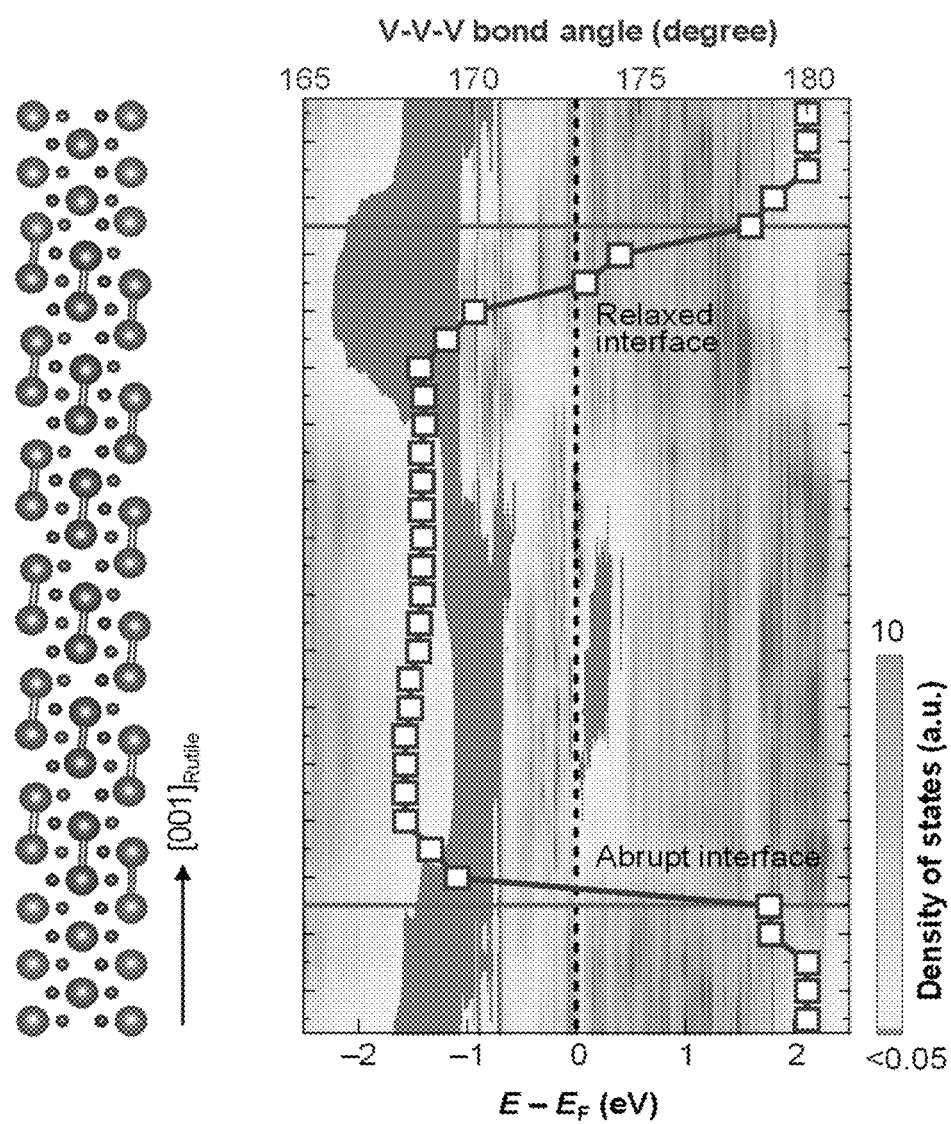
FIGS. 9A and 9B show the calculated electronic structure of the rutile/monoclinic heterostructure.

FIG. 9B shows a layer-resolved profile of the density of states (DOS) in the superlattice. Within the cell size used in the calculations, the whole monoclinic region exhibited a metallic characteristic, i.e., non-zero DOS at Fermi energy ($E_F$). To check possible contribution from structural relaxation (i.e., variation of monoclinic distortion and the V—V—V bond angle) at interfaces, the abrupt interface (i.e., lower interface in FIG. 9A) was considered, as well as the relaxed broad interface (i.e., upper interface in FIG. 9A). It was found that the metallization of monoclinic $VO_2$ occurred regardless of the types of interfaces. Furthermore, the density of states was calculated by capturing local monoclinic structures within the monoclinic region of the superlattice (FIGS. 10A and 10B), and the local structural modification itself was found to not cause any metallicity in monoclinic $VO_2$. This result excludes the main contribution of the interfacial structural relaxation and indicates a purely electronic origin behind the metallization of monoclinic $VO_2$.

The relaxed and abrupt $(001)_{Rutile}$ interface energies ($E_{i,rel}$, $E_{i,abr}$) were calculated by subtracting the bulk energies of monoclinic and rutile phases from the total energy of the monoclinic (n)/rutile (m) $(001)_R$nk superlattices (FIG. 9A):

$$E_{i,rel} = E_{HS} - nE_{MC} - mE_R - E_{i,abr} \qquad (Eq. 1)$$

$$E_{i,abr} = (E_{HS,fix} - nE_{MC} - mE_R)/2A \qquad (Eq. 2)$$

Here, n and m are the number of unit cells, $E_{MC}$ and $E_R$ are the bulk energies of monoclinic and rutile phases per unit cell, respectively. $E_{HS}$ is the total energy of the superlattice, $E_{HS,fix}$ is the total energy of the superlattice before relaxation, A is the in-plane lateral area of a unit cell, and a factor of two takes into account the presence of two interfaces in the superlattice. The calculated interface energy $E_{i,rel}$ was found to be small $E_{i,rel} \approx 60$ mJ m$^{-2}$, comparable to accuracy of the calculations. This value is much smaller than typical interfacial energies ~1 J m$^{-2}$ in metal/insulator interfaces.

Figure 11A:
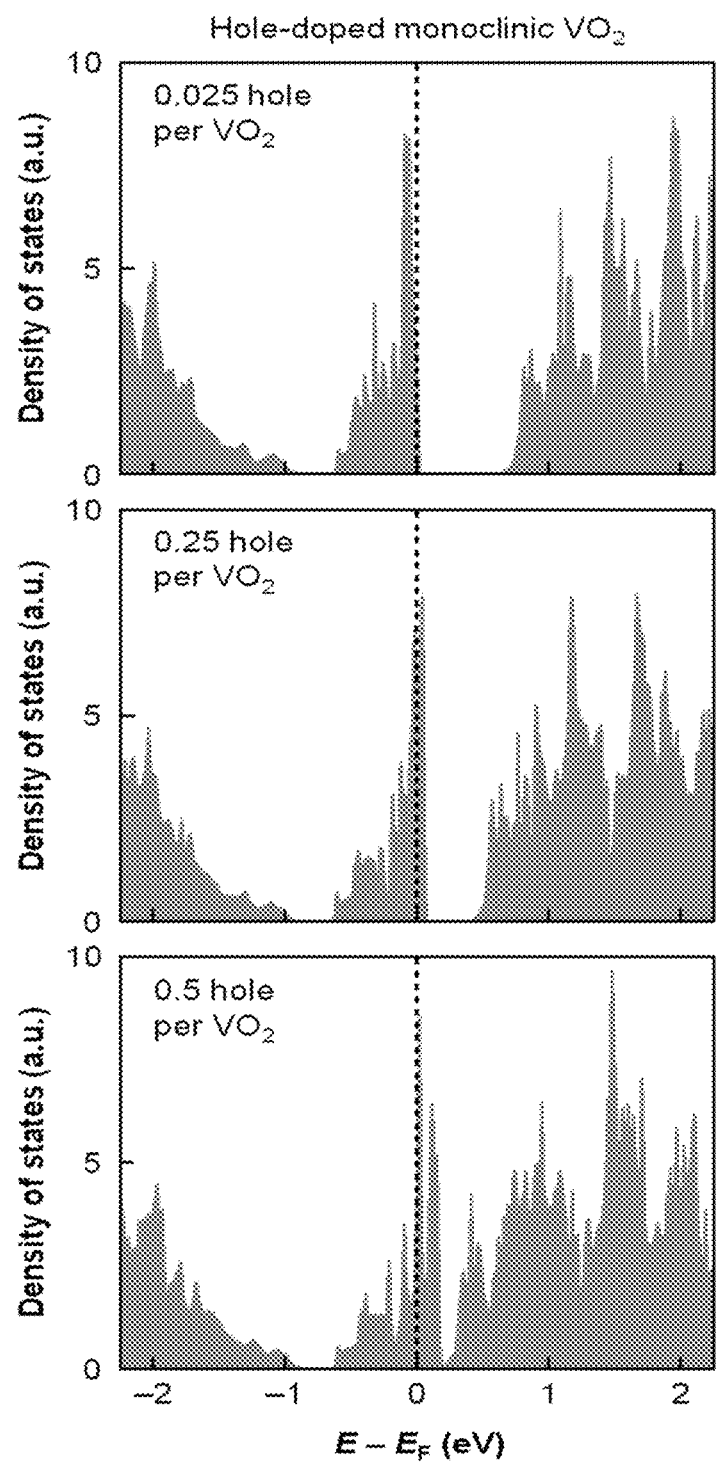
FIGS. 11A and 11B show the calculated electronic structure of hole- and electron-doped monoclinic $VO_2$.
Figure 11B:
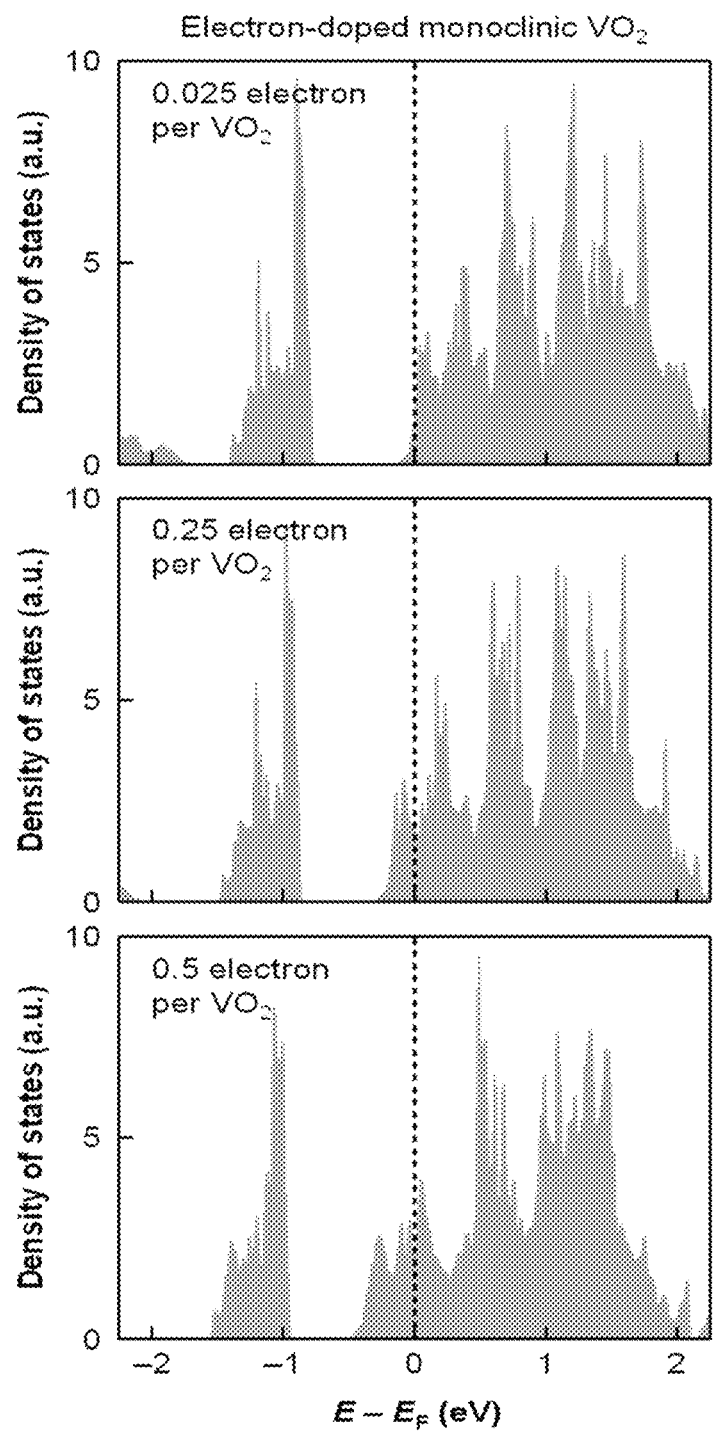

FIGS. 11A and 11B show the calculated density of states of hole-doped and electron-doped monoclinic $VO_2$, respectively, at hole/electron concentrations of 0.025 (top panels), 0.25 (middle panels), and 0.5 (bottom panels). It was found that increasing hole concentration caused a significant band gap narrowing, whereas the electron doping did not affect the gap much. The gap decreased with the increasing hole doping (i.e., lower d band occupation) and finally collapsed at high hole doping, which can be interpreted as the decrease in the strength of electron correlation. Notably, the density of states of the hole-doped monoclinic $VO_2$ looked similar to that of the metallic monoclinic region in the rutile/monoclinic superlattice (FIG. 5B).

Phase-Field Simulation

The metal-insulator and structural transition in $VO_2$ can be characterized by an electron-correlation order parameter $\eta_{EC}$ and a structural order parameter $\eta_S$, respectively. $\eta_{EC}$ denotes the electron spin density correlation between the electrons of two adjacent V atoms, and $\eta_S$ characterizes the dimerization of the V atoms. Nonzero $\eta_{EC}$ indicates the formation of the dynamical singlet and consequently the spin gap, corresponding to the insulating phase, while $\eta_{EC}=0$ refers to the metallic phase. The bulk molar Landau potential can be written as $$f_b = \frac{1}{2}a_1\frac{T-T_1}{T_1}\eta_{EC}^2 + \frac{1}{4}b_1\eta_{EC}^4 + \frac{1}{6}c_1\eta_{EC}^6 + \qquad (Eq. 3)$$
$$\frac{1}{2}a_2\frac{T-T_2}{T_2}\eta_S^2 + \frac{1}{4}b_2\eta_S^4 + \frac{1}{6}c_2\eta_S^6 - g_1\eta_{EC}\eta_S - \frac{1}{2}g_2\eta_{EC}^2\eta_S^2$$

where $a_1$, $b_1$, $c_1$, $a_2$, $b_2$, $c_2$, $g_1$, and $g_2$ are coefficients of the Landau polynomial, and are fitted based on the critical temperature and the entropy of transformation measured in this work and other experiments. (See, J. H. Park, et al., Measurement of a solid-state triple point at the metal-insulator transition in $VO_2$. *Nature* 500, 431-434 (2013).) The values of all the coefficients are listed in Table 1. Note that the experimental data are not sufficient to uniquely determine all the coefficients. However, the analysis and phase-field simulations are not very insensitive to the values of all the individual coefficients as long as they reproduce the critical features such as transition temperatures, and thus the physics presented in the main text is insensitive to the choice of some of the coefficients.

In the phase-field simulations, the gradient energy is taken into account $$F_{grad} = \int d^3 r \left[ \frac{1}{2} k_1 (\nabla \eta_{EC})^2 + \frac{1}{2} k_2 (\nabla \eta_S)^2 \right], \quad \text{(Eq. 4)}$$

where $k_1$ and $k_2$ are the gradient energy coefficients of $\eta_{EC}$ and $\eta_S$, respectively. The gradient energy coefficients $k_1$ and $k_2$ are positive and fitted to the interfacial energy of 50 mJ m$^{-2}$, which was arbitrarily chosen between an experimental estimation of 25 mJ m$^{-2}$ and a calculated upper bound of ~60 mJ m$^{-2}$ from the DFT simulation. Although the experiments cannot distinguish the contribution from the variation of $\eta_{EC}$ and that of $\eta_S$, it can be reasonably assumed that $k_1 > k_2$ since the bulk free energy of the electronic order parameter is of the same order with that of the structural order parameter in Eq. 3, based on the coefficients in Table 1 and the interfacial energy of a metal-insulator interface, which is typically larger than that of an interface separating two pure structural domains. [The metal-insulator interfacial energy has the typical value ~1 J m$^{-2}$, whereas the interfacial energy of two pure structural domains is within the range 0.01-0.2 J m$^{-2}$.] The values of the gradient energy coefficients are listed in Table 1.

TABLE 1

The values of Landau coefficients used.

| $a_1$ | $b_1$ | $c_1$ | $T_1$ | $a_2$ | $b_2$ |
|---|---|---|---|---|---|
| 8626 J/mol | −1675 J/mol | 1294 J/mol | 273K | 5176 J/mol | −668.3 J/mol |

| $c_2$ | $T_2$ | $g_1$ | $g_2$ | $k_1$ | $k_2$ |
|---|---|---|---|---|---|
| 696.5 J/mol | 283K | 0.8625 J/mol | 155.3 J/mol | 0.40 eV/nm | 0.16 eV/nm |

Figure 12A:
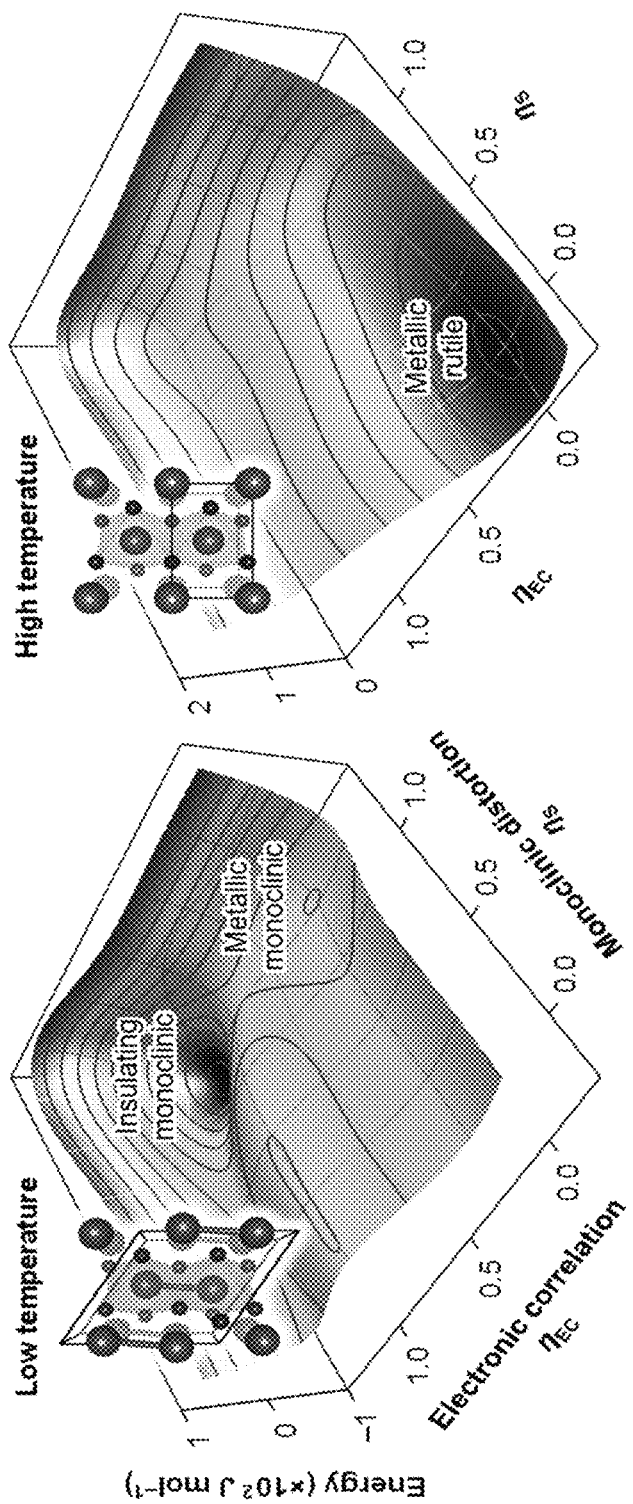
FIGS. 12A and 12B depict simulated phase transitions in bulk $VO_2$.
Figure 12B:
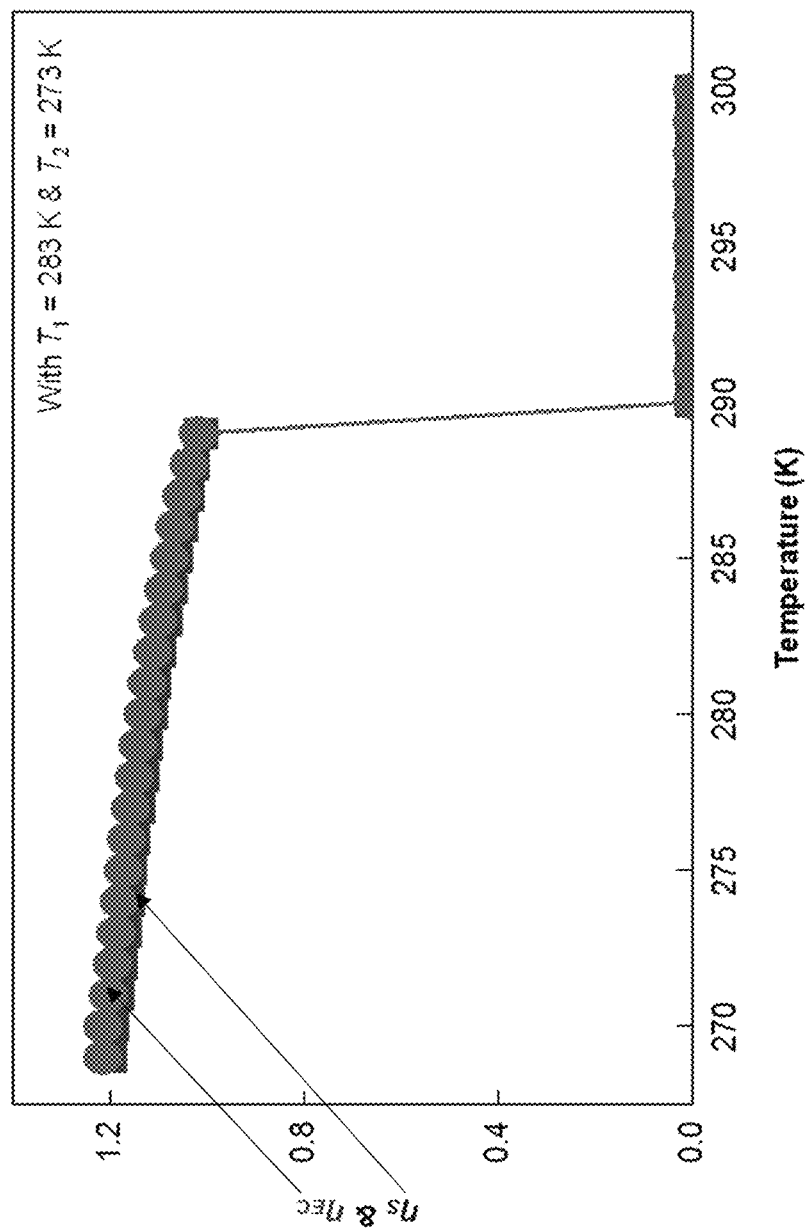

The energy landscapes of the bulk Landau potential at a low temperature and a high temperature are shown in FIG. 12A in the left and right panels, respectively. Above the transition temperature $T_{PT}$, the rutile phase ($\eta_{EC}=0$, $\eta_S=0$) always appears as the global minimum, i.e., the stable phase. Below the critical temperature, besides the insulating monoclinic stable phase ($\eta_{EC}=1$, $\eta_S=1$), a local minimum with order parameters $\eta_{EC}=0$ and $\eta_S=1$ can also be seen, which is identified as the metastable metallic monoclinic phase. The metastable metallic monoclinic phase disappears below $T_m \sim T_{PT} - 12$ K. FIG. 12B shows the temperature dependence of Is and qEc.

For $VO_{2-\delta}$, it was assumed that the off-stoichiometry decreases $T_1$ and $T_2$ (in Eq. 3) by the same amount. Therefore, for the individual $VO_{2-\delta}$ layer, although the transition temperature was decreased, the electronic transition and structural transition were always coupled. However, for the $VO_{2-\delta}/VO_2$ bilayer geometry, when the temperature $T_m$ was between the transition temperature of $VO_2$ and $VO_{2-\delta}$ layers, the situation was different. At $T_m$, the $VO_{2-\delta}$ layer was in the metallic rutile phase. For the $VO_2$ layer, the possible phases could be the insulating monoclinic or metallic monoclinic phases. Across the metallic rutile/insulating monoclinic interface, both the order parameters $\eta_{EC}$ and $\eta_S$ vary spatially, while across the metallic rutile/metallic monoclinic interface, only is varies, which results in smaller interfacial energy in the latter. This conclusion is insensitive to the specific value of $k_1$ and $k_2$ under the condition that both $k_1$ and $k_2$ are positive, which is almost always true. Denoting the bulk molar free energy difference of insulating monoclinic phase and metallic monoclinic phase as $\Delta f_b$, and their interfacial energy difference per area $\Delta f_{int}$ (FIGS. 13A and 13B), a critical thickness ($V_m$ is the molar volume of the rutile phase) can be calculated, $$t_c = \frac{\Delta f_{int} V_m}{\Delta f_b} \quad \text{(Eq. 5)}$$

below which the total free energy of the metallic monoclinic/rutile geometry will be lower than that of the insulating monoclinic/rutile geometry, resulting in a stable metallic monoclinic phase in the $VO_2$ layer. Therefore, although the metallic monoclinic phase has a larger bulk free energy than the insulating monoclinic phase, it can be stabilized below a critical thickness due to the smaller interfacial energy. Note that the specific value of $t_c$ depends on the choice of $k_1$ and $k_2$.

Next, phase-field simulations were employed to confirm the above hypothesis. (See, L.-Q. Chen, Phase-field models for microstructure evolution. *Ann. Rev. Mater. Res.* 32, 113-140 (2002).) The order parameters were evolved by solving the time-dependent Ginzburg-Landau (TDGL) equations $$\frac{\partial \eta_{EC}}{\partial t} = L_{EC} \frac{\delta F}{\delta \eta_{EC}} \ \& \ \frac{\partial \eta_S}{\partial t} = L_S \frac{\delta F}{\delta \eta_S} \quad \text{(Eqs. 6 and 7)}$$

where $L_{EC}$ and $L_S$ are the kinetic coefficients related to the domain wall mobility, and F is given by $F = \int f_b dn + F_{grad}$. In FIG. 13C, the phase-field simulations of the stable phases of the bilayer system are presented at different temperatures. As can be seen, the metallic monoclinic phase is stabilized at T=283 K in the $VO_2$ layer due to the interaction between the two layers.

Figure 15A:
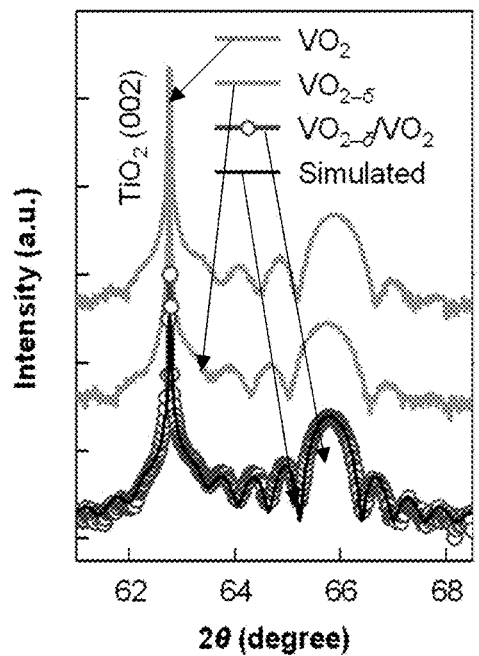
FIGS. 15A-15D show structural characterization of $VO_{2-\delta}/VO_2$ bilayer.
Figure 15B:
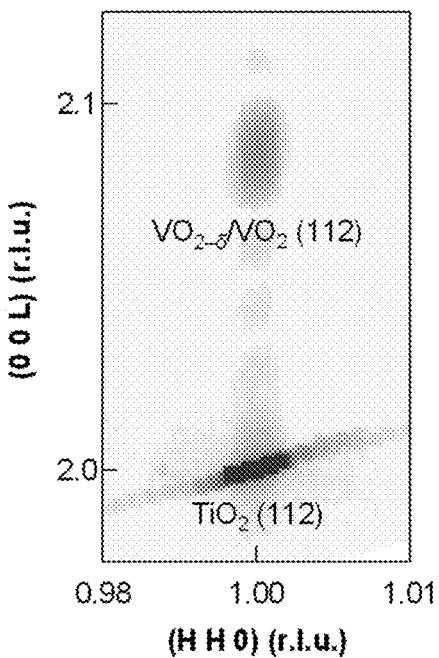
Figure 15C:
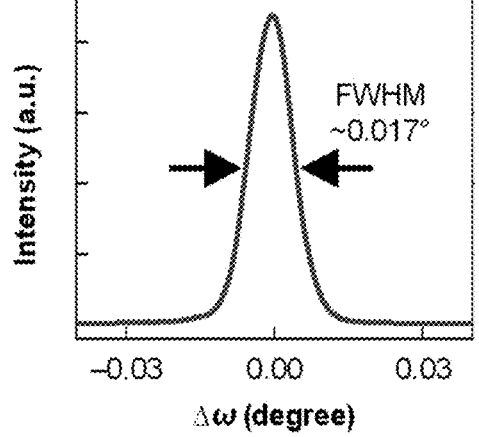

Thin Film Fabrication $VO_2$ epitaxial thin films were grown on a rutile $TiO_2$ (001) substrate using the pulsed laser deposition (PLD) method. A KrF excimer laser (248 nm) beam was focused on the vanadium metal target to an energy density of ~2.0 J cm$^{-2}$ and pulsed at 10 Hz. $VO_2$ films were grown at a substrate temperature of 300° C. and oxygen partial pressures ($P_{O2}$) ranging from 12 to 24 mTorr. The stoichiometric $VO_2$ and slightly oxygen-deficient $VO_{2-\delta}$ films were deposited at $P_{O2}$ of 21 and 18 mTorr, respectively. [The δ value was roughly estimated to be ~0.01 (FIG. 16B).] The crystal structure of the films was determined using a high-resolution four-circle XRD machine (Bruker D8 advance). FIGS. 15A-15C represent the results of XRD 2θ-ω scans, rocking curve, and reciprocal space mapping (RSM), respectively, for the $VO_2$ films. The full width at half maximum (FWHM) of rocking curve was measured as small as 0.017° (FIG. 15B), indicating the excellent crystalline quality of $VO_{2-\delta}/VO_2$ bilayer.

Figure 15D:
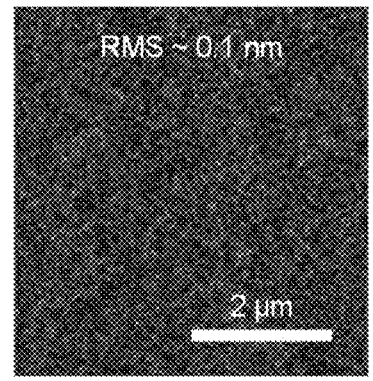

From the RSM data (FIG. 15C), it was confirmed that the $VO_{2-\delta}/VO_2$ bilayer is fully coherent with the $TiO_2$ substrate without any strain relaxation. Film surfaces were imaged by atomic force microscopy (AFM; FIG. 15D).

Figures 16A, 16B:
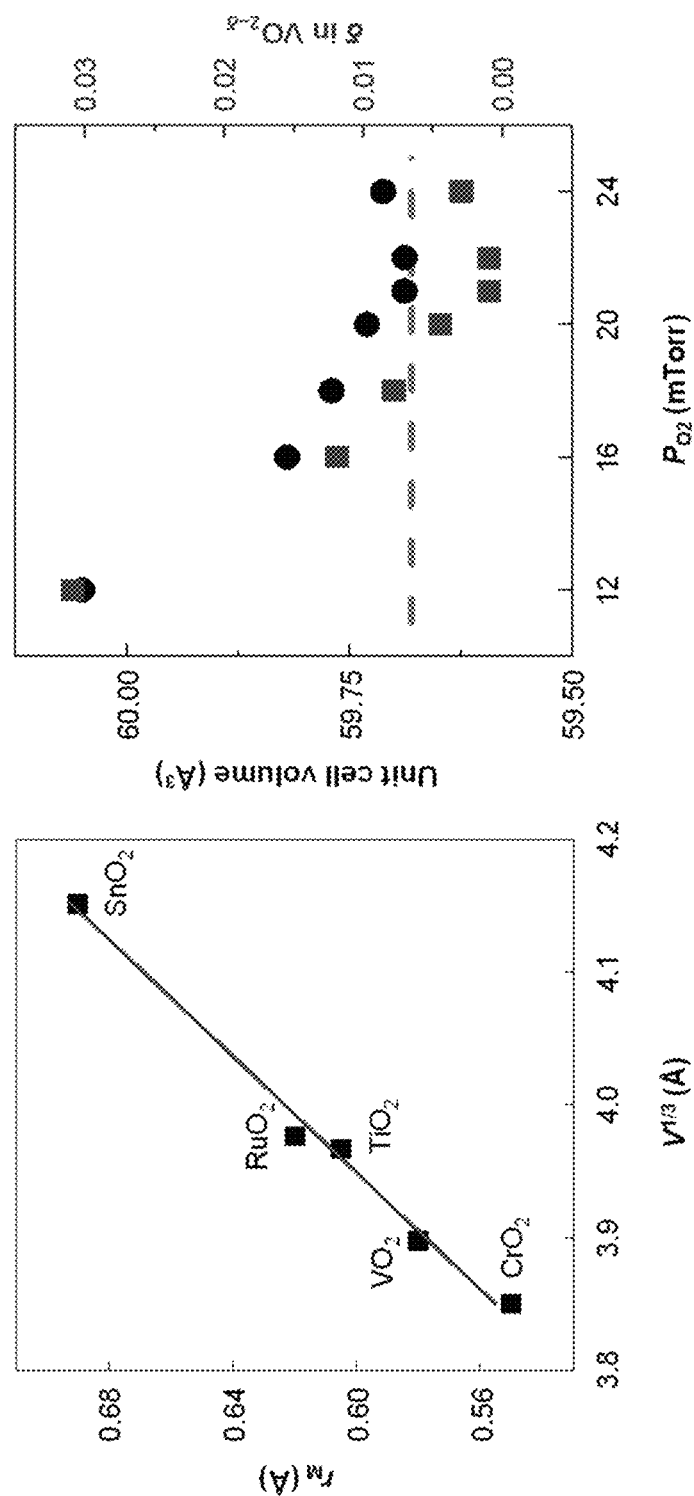
FIGS. 16A and 16B show a rough estimation of oxygen stoichiometry.

The concentration of oxygen vacancies in the films was roughly estimated from the measured unit-cell volume. According to the empirical model, the unit-cell volume V can be expressed as follows:

$$r_M = A \cdot V^{1/3} - B \tag{Eq. 8}$$

where $r_M$ is the ionic radius of the cation, V is the unit cell volume, and A and B are constants. (See, L. Q. Jiang, et al., Prediction of lattice constant in cubic perovskites. *J. Phys. Chem. Solids* 67, 1531-1536 (2006).) From the relationship between $r_M$ and V in rutile oxides, A and B were determined to be 0.4555 and 1.2001, respectively (FIG. 16A). By assuming oxygen-deficient $VO_{2-\delta}$ for simplicity, the effective cation radius can be defined as:

$$r_M = (1-2\delta) \cdot r_{V^{4+}} + (2\delta) \cdot r_{V^{3+}} = 0.58 + 0.12\delta \tag{Eq 9}$$

where $r_{V4+}$ and $r_{V3+}$ are the ionic radii of $V^{4+}$ and $V^{3+}$, respectively. (See, D. Marrocchelli, et al., Understanding chemical expansion in non-stoichiometric oxides: ceria and zirconia case studies. *Adv. Funct. Mater.* 22, 1958-1965 (2012).) The values for these radii are all available from the work of Shannon. (See, R. D. Shannon, Revised effective ionic radii and systematic studies of interatomic distances in halides and chalcogenides. *Acta Crystallogr.*, Sect. A 32, 751-767 (1976).) Then, the $\delta$ values were determined (i.e., the concentration of oxygen vacancies) from the measured unit-cell volume as follows (FIG. 16B):

$$\delta = \frac{0.4555 \times (V_{stoichiometric} + \Delta V)^{1/3} - 1.78001}{0.12} \tag{Eq. 10}$$

where $V_{Stoichiometric}$ and $V_{Stoichiometric} + \Delta V$ are the unit cell volume of stoichiometric $VO_2$ and oxygen deficient $VO_{2-\delta}$, respectively. As shown in FIG. 15B, the $\delta$ value was roughly estimated as ~0.01 for the $VO_{2-\delta}$ film grown at $P_{O2}=18$ mTorr.

Figures 14A, 14B:
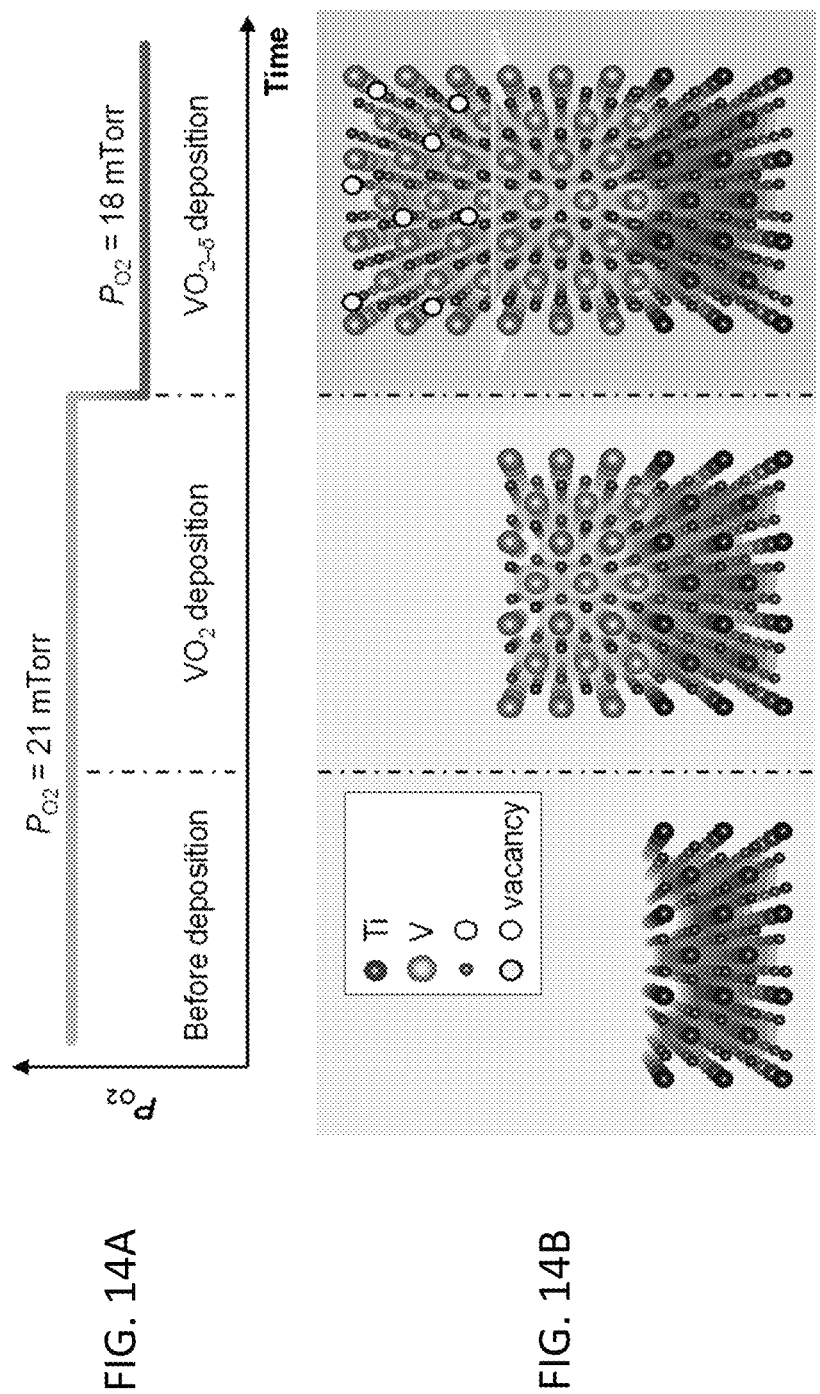
FIGS. 14A and 14B show the growth of the $VO_{2-\delta}/VO_2$ bilayer. By changing the oxygen partial pressure ($P_{O2}$) during film growth [as shown in FIG. 14A], the $VO_{2-\delta}/VO_2$ bilayer nanostructure can be prepared [as shown in FIG. 14B], which has two distinct transition temperatures in its upper (i.e., $VO_{2-\delta}$) and lower ($VO_2$) layers.

The $VO_{2-\delta}/VO_2$ bilayer was prepared by first growing the $VO_2$ layer at $P_{O2}=21$ mTorr and then growing the $VO_{2-\delta}$ layer at $P_{O2}=18$ mTorr (FIGS. 14A and 14B). To confirm that the $P_{O2}$ variation after growth doesn't affect the physical properties of the already-grown $VO_2$ films, two samples were prepared (FIGS. 17A and 17B). Whereas one sample was grown and cooled at $P_{O2}=21$ mTorr, the other was grown at $P_{O2}=21$ mTorr, then annealed for 10 minutes at a reduced $P_{O2}=17$ mTorr, and cooled at $P_{O2}=17$ mTorr. FIGS. 17A and 17B exhibit the XRD and transport data, respectively, for those samples, showing negligible change in sample properties even after the additional annealing at the reduced $P_{O2}$. This indicate that while the $P_{O2}$ variation during growth affects the oxygen stoichiometry and the resulting metal-insulator transition of $VO_2$ films, the $P_{O2}$ variation after growth doesn't affect those much.

To check if the sequence of $VO_{2-\delta}$ and $VO_2$ layer in the bilayer affects the phase transitions, two different bilayers were grown, i.e., $VO_{2-\delta}/VO_2$ and $VO_2/VO_{2-\delta}$ bilayers, on $TiO_2$ (001) substrate. The $VO_2/VO_{2-\delta}$ bilayer was prepared, by first growing the $VO_{2-\delta}$ layer at $P_{O2}=18$ mTorr and then growing the $VO_2$ layer at $P_{O2}=21$ mTorr. As shown in FIG. 20A, the sequence of $VO_{2-\delta}$ and $VO_2$ layer in the bilayer didn't induce any change in phase transitions. The metal-insulator transitions of both the $VO_{2-\delta}/VO_2$ and $VO_2/VO_{2-\delta}$ bilayers follow that of the $VO_{2-\delta}$ single layer.

Scanning Transmission Electron Microscopy (STEM) and EELS

For electron microscopic analysis, the thin, electron-transparent sample was prepared using the conventional method (mechanical thinning to ~10 μm or less; and ion beam milling to electron transparency at an acceleration voltage of 0.5-3.5 kV using an Ar ion beam). The atomic structures were observed using a STEM (JEOL JEM-2100F, JEOL Ltd., Japan) with an aberration corrector (CEOS GmbH, Heidelberg, Germany); and its probe diameter and convergence angle of the beam were ~0.9 Å and ~24 mrad under the acceleration voltage of 200 kV, respectively. The collection semiangles of the detectors for high angle annular dark field (HAADF) and low angle annular dark field (LAADF) imaging were greater than 80-200 and 30-60 mrad, respectively. The obtained STEM images were local wiener filtered to reduce background noise (HREM Research Inc., Japan).

Figure 18C:
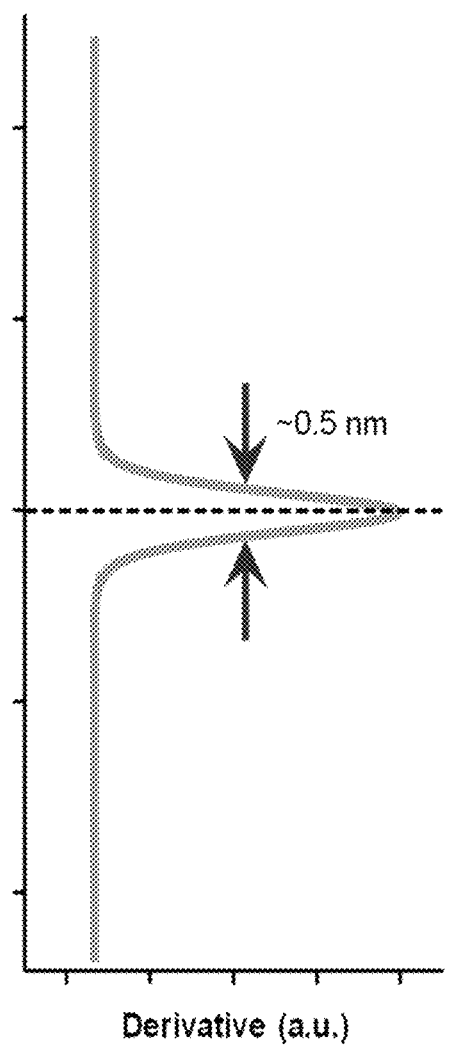
FIG. 18C shows a derivative of the fitted line (thick solid) for the LAADF contrast profile in B.

In contrast to the HAADF, so called Z-contrast, which provides the atomic weight, LAADF can provide the qualitative information of the atomic dechanneling mainly caused by the strain or the vacancies due to the low-order diffractions of electrons, close to the on-axis. As shown in FIGS. 18A and 18B, the HAADF and LAADF contrasts, respectively, were profiled for better visualization, wherein the stronger LAADF contrast from the upper half indicates the existence of oxygen vacancies. LAADF image confirms that the film consists of $VO_2$ and $VO_2$-z layers.

Energy loss spectra were obtained at 200 kV using an electron energy loss spectrometer (EELS; Quantum GIF, Gatan, United States) with an energy resolution of 0.8 eV (FIG. 19B). Theoretical calculation of V-$L_{2,3}$ and O-K edge EELS were performed by using the DFT calculation, CASTEP embedded in Materials Studio (Biovia, United States). For the calculation, a 3×3×3 supercell of rutile $VO_2$ was used; the interactions among the electrons were calculated by using the core-hole method; and the electronic interactions were treated as the local density approximation.

Figure 19C:
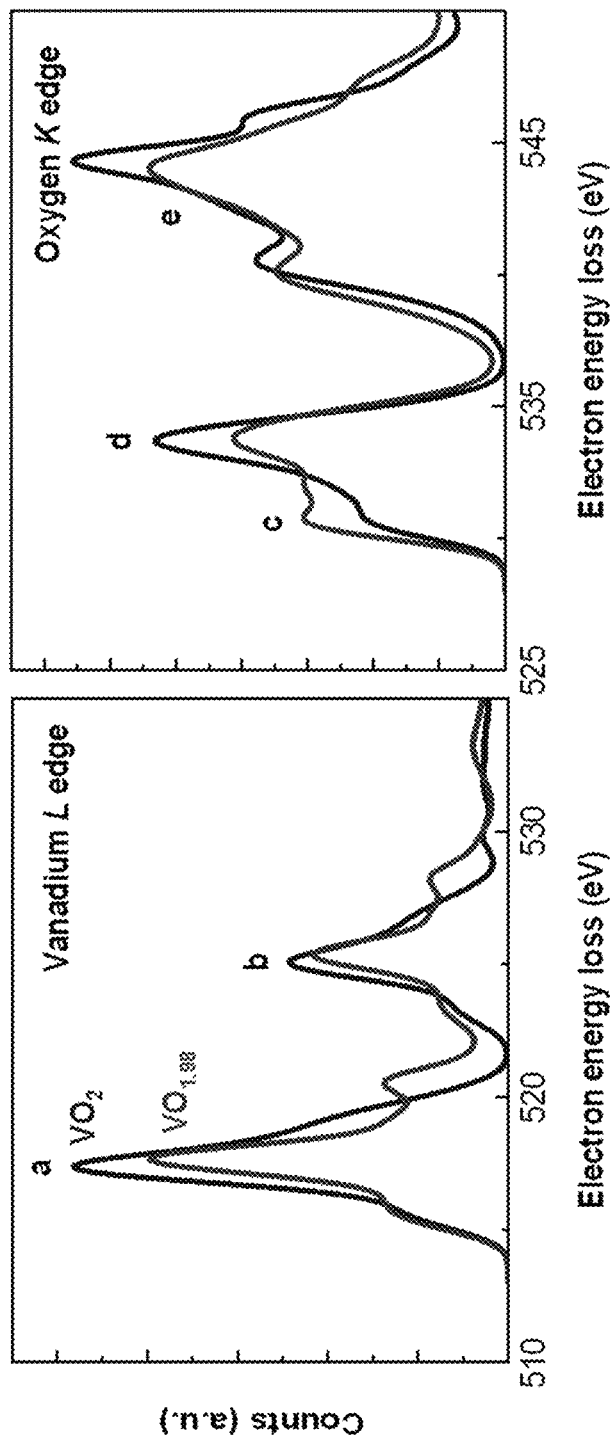

Suppression of the first peak in V-$L_{2,3}$ (FIG. 19C, left panel) and the second peak in O-K (FIG. 19C, right panel) is related with the less electron density in p-V and s-O orbitals caused by the oxygen vacancies. The measured EELS data for the $VO_2$ and $VO_{2-\delta}$ layers were consistent with the calculated results for $VO_2$ and $VO_{1.98}$ (FIG. 19C, left and right panels).

Electrical Transport Measurements

The metal-insulator transition in $VO_2$ films was monitored by measuring their electrical resistivity as a function of temperature. Electrical resistivity was measured using a four-contact van der Pauw technique. For the transport measurements, both indium and aluminum metal contacts were tried, but little change was found in the data. The metal-insulator transition (e.g., the transition temperature) of $VO_{2-\delta}/VO_2$ bilayer was found to be almost identical to that of $VO_{2-\delta}$ single layer (FIG. 8A). If the $VO_2$ and $VO_{2-\delta}$ layers in the bilayer are independent of each other without any interaction, there should be a clear two-step signature in the metal-insulator transition, as shown in FIG. 21A. To confirm this, the interfacial effect was intentionally suppressed by inserting an ultrathin (~2 nm) $TiO_2$ layer between $VO_{2-\delta}$ and $VO_2$. The $VO_{2-\delta}/TiO_2/VO_2$ trilayer showed a clear two-step metal-insulator transition (FIG. 21B), which verified the interfacial effect as the intrinsic origin of the collective, single-step metal-insulator transition in the $VO_{2-\delta}/VO_2$ bilayer.

Hall Measurements were conducted, sourcing a DC current and sweeping the magnetic field over a range of −7 T to 7 T. All Hall data were linear with respect to magnetic field. Consequently, single-band model was fit, using $$n_{3D} = \frac{I}{\frac{dV_H}{dB} \cdot t \cdot q}$$

to extract the carrier density (FIG. 20B). In the previous expression, I was the DC current sourced, $V_H$ the Hall voltage, t the thin-film thickness, and q the electron charge.

Raman Spectroscopy

Raman spectra of $VO_2$ thin films grown on $TiO_2$ (001) substrates have been measured in backscattering geometry normal to the film surface using a Jobin Yvon T64000 triple spectrometer equipped with a liquid nitrogen cooled multi-channel charge coupled device detector. Several excitation wavelengths were tried, visible (442 and 488 nm), and UV (325 and 363.8 nm). It was found that with visible excitation the spectra are dominated by the substrate signal. 363.8-nm excitation was chosen as it resulted in a stronger signal from $VO_2$ films. Spectra were measured in the temperature range 250-300 K using a variable temperature closed cycle helium cryostat. The high-temperature metallic phase of bulk $VO_2$ had a tetragonal rutile structure with space group $D_{4h}^{14}$ ($P4_2/mnm$) and four Raman-active phonons. In metallic phase, the phonon peaks were very broad and weak; they were hardly observable even in the bulk. In the thin film samples, the spectra above the transition temperature contained the $TiO_2$ substrate features only. The low-temperature phase had a monoclinically distorted structure with space group $C_{2h}^5$ ($P2_1/c$). The unit cell doubled in size in the monoclinic phase, which had 18 Raman-active phonons ($9A_g$ and $9B$ modes). In the low-temperature spectra, seven $A_g$ modes could be distinguished at 151, 225, 196, 316, 393, 457, and 499 $cm^{-1}$ (two more $A_g$ modes that should appear around 595 and 618 $cm^{-1}$ are masked by strong peak of the $TiO_2$ substrate at 612 $cm^{-1}$). Also, three $B_g$ modes could be seen at 335, 437, and 812 $cm^{-1}$; the others were either too weak or overlapped by the substrate features.

Figure 22:
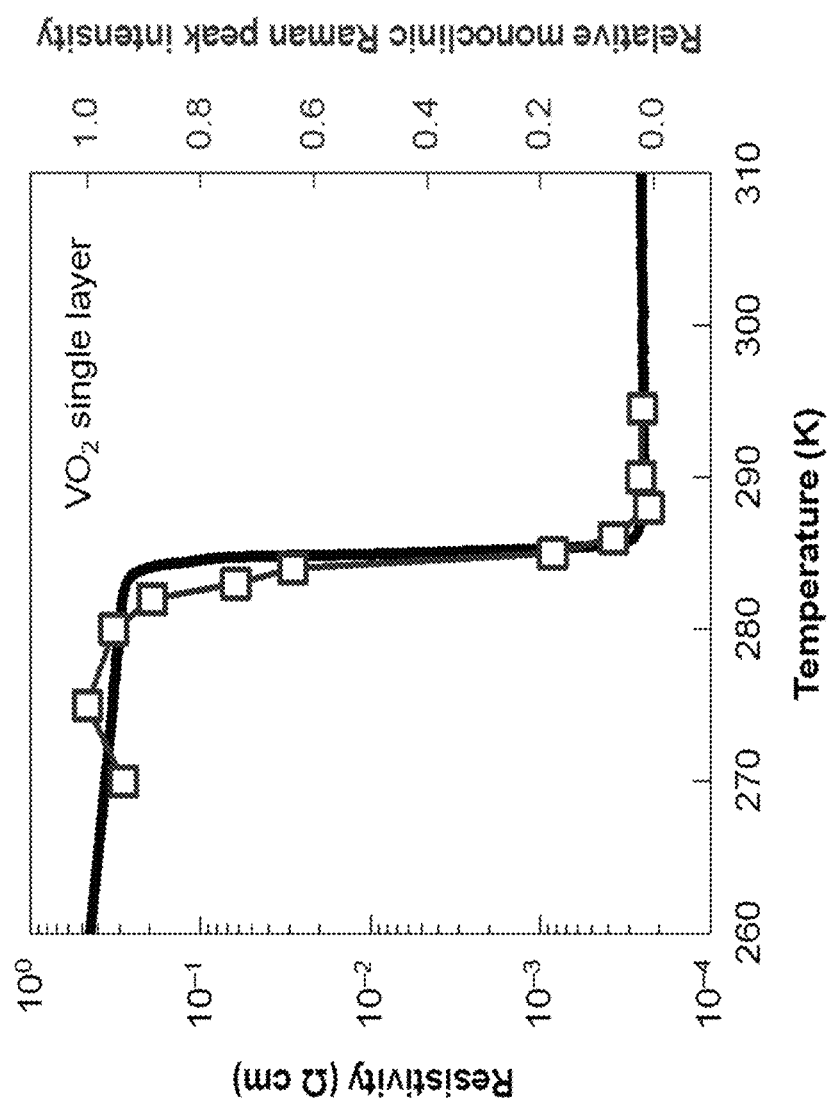
FIG. 22 depicts metal-insulator and structural phase transitions of the VO$_2$ single layer. Metal-insulator and structural phase transitions, measured on cooling in VO$_2$ single layer, show a single-step feature.

The temperature dependence of the relative Raman intensity of the two most intensive $VO_2$ peaks (i.e., $\omega_2$ and $\omega_3$ near 196 and 316 $cm^{-1}$) was obtained, which originated from the monoclinic distortion in $VO_2$ (FIG. 7B). The integrated intensities of these peaks were normalized by the integrated intensity of the 612 $cm^{-1}$ peak of $TiO_2$ substrate. Initially at high temperatures, $VO_2$ was in the tetragonal rutile phase, and the intensity of the monoclinic $VO_2$ peaks was essentially zero. With decreasing temperatures, the Raman peaks of monoclinic $VO_2$ appeared suddenly during the rutile-to-monoclinic structural phase transition (FIGS. 7A and 7B). The Raman spectroscopy measurements showed that the $VO_{2-\delta}/VO_2$ bilayer had a two-step structural phase transition (FIG. 7B), whereas the $VO_2$ single layer had a single-step structural phase transition (FIG. 22).

X-Ray Diffraction Measurement

Figure 7C:
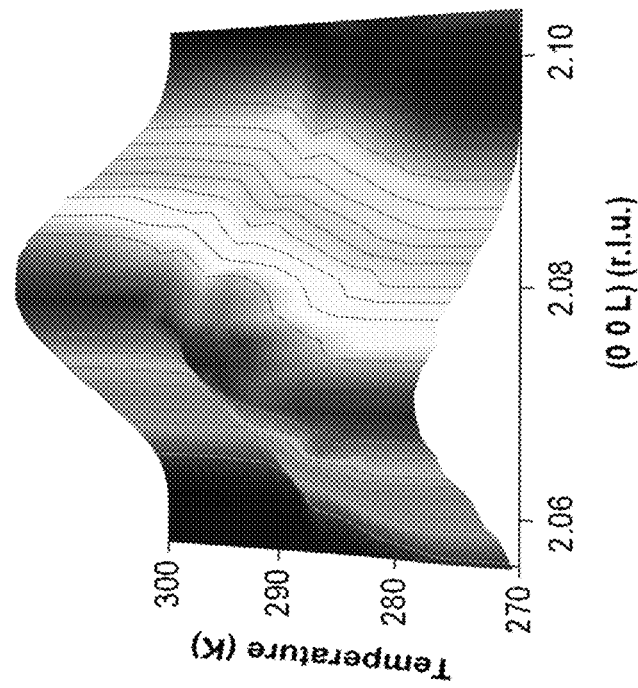
Figure 7D:
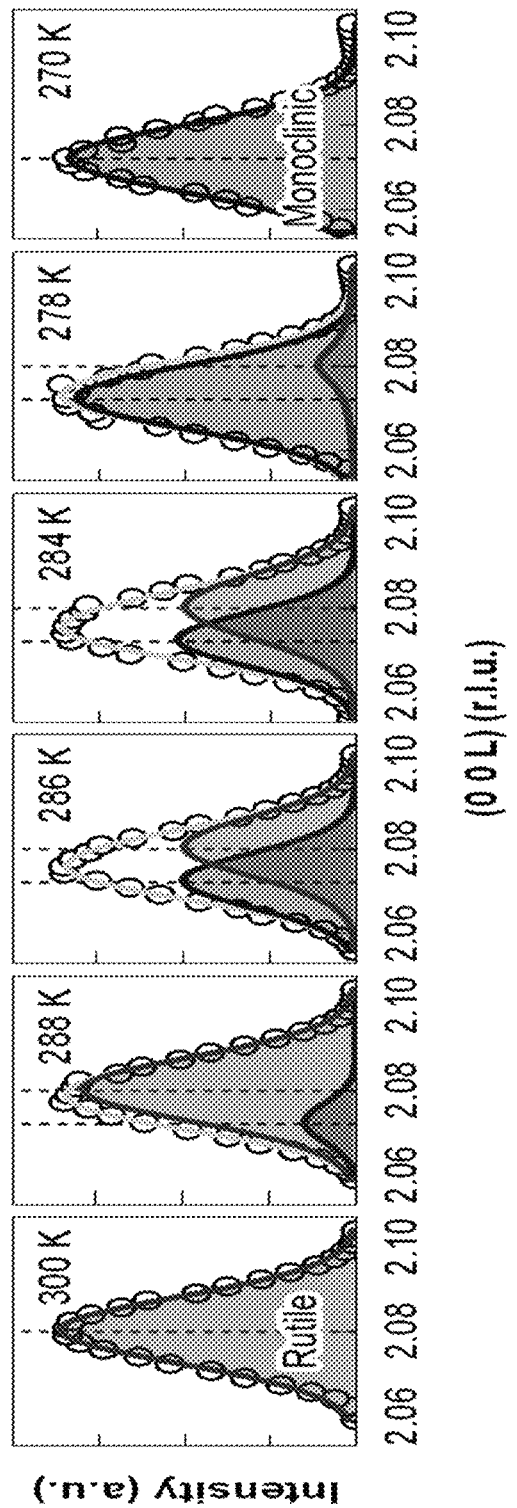

The rutile-to-monoclinic structural phase transition was monitored by conducting X-ray diffraction (XRD) (00L) scans on cooling at 300K (FIG. 7D, top panel), 284 K (FIG. 7D, middle panel), and 272 K (FIG. 7D, bottom panel). Before the measurement, the sample was aligned using the (002) reflection of the $TiO_2$ substrate. Due to the increased out-of-plane lattice during monoclinic distortion, the center L (Reciprocal Lattice Units-RLU) position of the XRD peaks was shifted from ~2.080 (for high-temperature rutile) to ~2.072 (for low-temperature monoclinic). Based on this, the measured XRD peaks were fitted using two Gaussian curves (shown in FIG. 7D) with the L values of 2.080±0.0005 RLU (for rutile) and 2.072±0.0005 RLU (for monoclinic). The relative monoclinic portion was estimated to be $A_{Mc}/(A_{Mc}+A_R)$, where $A_R$ and $A_{Mc}$ correspond to the area under the two fitted Gaussian curves. In FIGS. 7C and 7D, the maximum peak intensity was normalized with the value at 300 K.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A bilayer comprising:
   a first layer of vanadium dioxide characterized in that it undergoes a rutile-to-monoclinic structural phase transition at a first structural transition temperature; and
   a second layer of vanadium dioxide adjacent to the first layer of vanadium dioxide, the second layer of vanadium dioxide characterized in that it undergoes a rutile-to-monoclinic structural phase transition at a second structural transition temperature that is higher than the first structural transition temperature, wherein the second layer of vanadium dioxide has a stable metallic monoclinic phase at a temperature between the first structural transition temperature and the second structural transition temperature.

2. The bilayer of claim 1, wherein the first structural transition temperature and the second structural transition temperate are in the range from 275 K to 290 K and the first structural transition temperature is at least 5 K lower than the second structural transition temperature.

3. The bilayer of claim 1, wherein the second layer of vanadium dioxide has a thickness of less than 10 nm.

4. The bilayer of claim 1, having a single-step metal-insulator electronic transition temperature in the range from 275 K to 285 K.

5. The bilayer of claim 1, wherein the first layer of vanadium dioxide comprises extrinsically doped vanadium dioxide and the second layer of vanadium dioxide comprises stoichiometric $VO_2$.

6. The bilayer of claim 5, wherein the extrinsically doped vanadium dioxide is tungsten doped vanadium dioxide.

7. The bilayer of claim 1, wherein the first layer of vanadium dioxide comprises non-stoichiometric, oxygen-deficient $VO_{2-\delta}$, where $\delta$ represents a quantity of oxygen vacancies, and the second layer of vanadium dioxide comprises stoichiometric $VO_2$.

8. The bilayer of claim 1, wherein first layer of vanadium dioxide has a thickness of less than 10 nm and the second layer of vanadium dioxide has a thickness of less than 10 nm.

9. The bilayer of claim 1, wherein the bilayer is a heterostructure consisting only of the first and second layers of vanadium dioxide.

10. A method of inducing a single-step metal-insulator electronic transition in a bilayer comprising:
   a first layer of vanadium dioxide characterized in that it undergoes a rutile-to-monoclinic structural phase transition at a first structural transition temperature; and
   a second layer of vanadium dioxide adjacent to the first layer of vanadium dioxide, the second layer of vanadium dioxide characterized in that it undergoes a rutile-to-monoclinic structural phase transition at a second structural transition temperature that is higher than the first structural transition temperature, wherein the second layer of vanadium dioxide has a stable metallic monoclinic phase at a temperature between the first structural transition temperature and the second structural transition temperature, the method comprising:
   maintaining the bilayer at a temperature above the first structural transition temperature; and
   applying an external stimulus to the bilayer, wherein the external stimulus induces the second layer of vanadium dioxide to undergo an isostructural electronic phase transition from an electrically insulating monoclinic crystalline phase to an electrically conducting monoclinic crystalline phase.

11. The method of claim 10, wherein applying an external stimulus to the bilayer comprises applying a voltage across the bilayer.

12. The method of claim 10, wherein applying an external stimulus to the bilayer comprises heating the bilayer.

13. An electrical switching device comprising:
   a bilayer comprising:
   a first layer of vanadium dioxide characterized in that it undergoes a rutile-to-monoclinic structural phase transition at a first structural transition temperature; and
   a second layer of vanadium dioxide adjacent to the first layer of vanadium dioxide, the second layer of vanadium dioxide characterized in that it undergoes a rutile-to-monoclinic structural phase transition at a second structural transition temperature that is higher than the first structural transition temperature, wherein the second layer of vanadium dioxide has a stable metallic monoclinic phase at a temperature between the first structural transition temperature and the second structural transition temperature;
   a first electrically conducting contact in electrical communication with a first area of the bilayer;
   a second electrically conducting contact in electrical communication with a second area of the bilayer; and
   an external stimulus source configured to apply a metal-insulator transition-inducing external stimulus to the bilayer.

14. The switching device of claim 13, wherein the external stimulus source is a voltage source configured to apply a voltage across the bilayer.

15. The switching device of claim 13, wherein the switching device is a capacitor in which the second layer of vanadium dioxide is disposed between the first layer of vanadium dioxide and a third layer of vanadium dioxide, the third layer of vanadium dioxide characterized in that it undergoes a rutile-to-monoclinic structural phase transition at a third structural transition temperature that is lower than the second structural transition temperature, and further wherein the first electrically conducting contact is in electrical communication with the first layer of vanadium dioxide and the second electrically conducting contact is in electrical communication with the third layer of vanadium dioxide.

16. The switching device of claim 13, wherein the switching device is a field-effect switch comprising:
   a source in electrical communication with the first electrically conducting contact;
   a drain in electrical communication with the second electrically conducting contact, wherein the source and drain are configured to be in electrical communication through the second layer of vanadium dioxide when the field effect switch is on; and
   a gate stack comprising: a gate dielectric on the second layer of vanadium dioxide and a gate contact on the gate dielectric.

17. A method of switching a current using the switching device comprising:
   a bilayer comprising:
   a first layer of vanadium dioxide characterized in that it undergoes a rutile-to-monoclinic structural phase transition at a first structural transition temperature; and
   a second layer of vanadium dioxide adjacent to the first layer of vanadium dioxide, the second layer of vanadium dioxide characterized in that it undergoes a rutile-to-monoclinic structural phase transition at a second structural transition temperature that is higher than the first structural transition temperature, wherein the second layer of vanadium dioxide has a stable metallic monoclinic phase at a temperature between the first structural transition temperature and the second structural transition temperature;
   a first electrically conducting contact in electrical communication with a first area of the bilayer;
   a second electrically conducting contact in electrical communication with a second area of the bilayer; and
   an external stimulus source configured to apply a metal-insulator transition-inducing external stimulus to the bilayer, the method comprising:
   maintaining the bilayer at a temperature above the first structural transition temperature;
   applying an external stimulus from the external stimulus source to the bilayer, wherein the external stimulus induces the second layer of vanadium dioxide to undergo an isostructural electronic phase transition from an electrically insulating monoclinic crystalline phase to an electrically conducting monoclinic crystalline phase; and
   passing a current from the first electrically conducting contact to the second electrically conducting contact, through the bilayer.

18. A method of switching a capacitor comprising:
   a bilayer comprising:
   a first layer of vanadium dioxide characterized in that it undergoes a rutile-to-monoclinic structural phase transition at a first structural transition temperature; and
   a second layer of vanadium dioxide adjacent to the first layer of vanadium dioxide, the second layer of vanadium dioxide characterized in that it undergoes a rutile-to-monoclinic structural phase transition at a second structural transition temperature that is higher than the first structural transition temperature, wherein the second layer of vanadium dioxide has a stable metallic monoclinic phase at a temperature between the first structural transition temperature and the second structural transition temperature;
a third layer of vanadium dioxide, wherein the second layer of vanadium dioxide is disposed between the first layer of vanadium dioxide and the third layer of vanadium dioxide and the third layer of vanadium dioxide characterized in that it undergoes a rutile-to-monoclinic structural phase transition at a third structural transition temperature that is lower than the second structural transition temperature;
a first electrically conducting contact in electrical communication with the first layer of vanadium dioxide;
a second electrically conducting contact in electrical communication with the third layer of vanadium dioxide; and
an external stimulus source configured to apply a metal-insulator transition-inducing external stimulus to the bilayer, the method comprising:
maintaining the capacitor at a temperature above the first and third structural transition temperatures;
charging the first layer of vanadium dioxide and the third layer of vanadium dioxide when the second layer of vanadium dioxide is an electrically insulating state; and
applying an external stimulus from the external stimulus source to the capacitor, wherein the external stimulus induces the second layer of vanadium dioxide to undergo an isostructural electronic phase transition from an electrically insulating monoclinic crystalline phase to an electrically conducting monoclinic crystalline phase, whereby the first and third layers of vanadium dioxide are discharged through the second layer of vanadium dioxide.

19. A method of switching a current using a field effect switch comprising:
a bilayer comprising:
a first layer of vanadium dioxide characterized in that it undergoes a rutile-to-monoclinic structural phase transition at a first structural transition temperature; and
a second layer of vanadium dioxide adjacent to the first layer of vanadium dioxide, the second layer of vanadium dioxide characterized in that it undergoes a rutile-to-monoclinic structural phase transition at a second structural transition temperature that is higher than the first structural transition temperature, wherein the second layer of vanadium dioxide has a stable metallic monoclinic phase at a temperature between the first structural transition temperature and the second structural transition temperature;
a first electrically conducting contact in electrical communication with a first area of the bilayer;
a second electrically conducting contact in electrical communication with a second area of the bilayer;
an external stimulus source configured to apply a metal-insulator transition-inducing external stimulus to the bilayer;
a source in electrical communication with the first electrically conducting contact;
a drain in electrical communication with the second electrically conducting contact, wherein the source and drain are configured to be in electrical communication through the second layer of vanadium dioxide when the field effect switch is on; and
a gate stack comprising: a gate dielectric on the second layer of vanadium dioxide and a gate contact on the gate dielectric, the method comprising:
maintaining the bilayer at a temperature above the first structural transition temperature;
applying a gate voltage from the external voltage source to the gate contact, wherein the gate voltage induces the second layer of vanadium dioxide to undergo an isostructural electronic phase transition from an electrically insulating monoclinic crystalline phase to an electrically conducting monoclinic crystalline phase; and
passing a current from the first electrically conducting contact to the second electrically conducting contact, through the second layer of vanadium dioxide.

* * * * *